United States Patent
Sato et al.

(10) Patent No.: US 8,304,657 B2
(45) Date of Patent: Nov. 6, 2012

(54) PRINTED WIRING BOARD AND METHOD FOR MANUFACTURING PRINTED WIRING BOARD

(75) Inventors: Hiroyuki Sato, Ogaki (JP); Tomohiko Murata, Ogaki (JP); Fusaji Nagaya, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 174 days.

(21) Appl. No.: 12/954,052

(22) Filed: Nov. 24, 2010

(65) Prior Publication Data

US 2011/0232948 A1   Sep. 29, 2011

Related U.S. Application Data

(60) Provisional application No. 61/317,408, filed on Mar. 25, 2010.

(51) Int. Cl.
*H05K 1/03* (2006.01)

(52) U.S. Cl. ........ 174/255; 174/250; 174/262; 174/264; 174/266

(58) Field of Classification Search .................. 174/255, 174/250, 262, 264, 266
See application file for complete search history.

(56) References Cited

U.S. PATENT DOCUMENTS

| 7,251,885 B2 * | 8/2007 | Nishii | .............................. | 29/852 |
| 8,101,865 B2 * | 1/2012 | Ikeda | ............................. | 174/255 |

FOREIGN PATENT DOCUMENTS

| JP | 2000-223810 | 8/2000 |
| JP | 2005-050877 | 2/2005 |
| JP | 2006-041463 | 2/2006 |
| KR | 10-2010-0029858 | 3/2010 |

* cited by examiner

*Primary Examiner* — Yuriy Semenenko
*Assistant Examiner* — Andargie M Aychillhum
(74) *Attorney, Agent, or Firm* — Oblon, Spivak, McClelland, Maier & Neustadt, L.L.P.

(57) ABSTRACT

A printed wiring board includes a core substrate having a penetrating hole, a first circuit on a first surface of the substrate, a second circuit on a second surface of the substrate, and a through-hole conductor in the hole connecting the first and second circuits. The hole has first and second opening portions. The first opening portion becomes thinner toward the second surface. The second opening portion becomes thinner toward the first surface. The first opening portion has first and second portions. The second opening portion has first and second portions. The first and second portions of the first opening portion form inner walls bending inward at the boundary between the first and second portions. The first and second portions of the second opening portion form inner walls bending inward at the boundary between the first and second portions.

14 Claims, 16 Drawing Sheets

FIG. 2
(A)
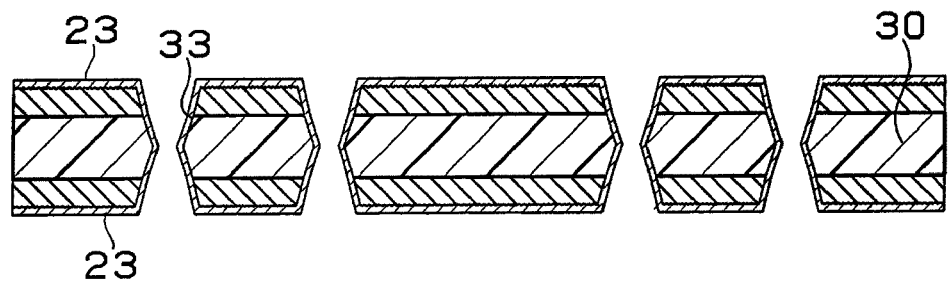
(B)
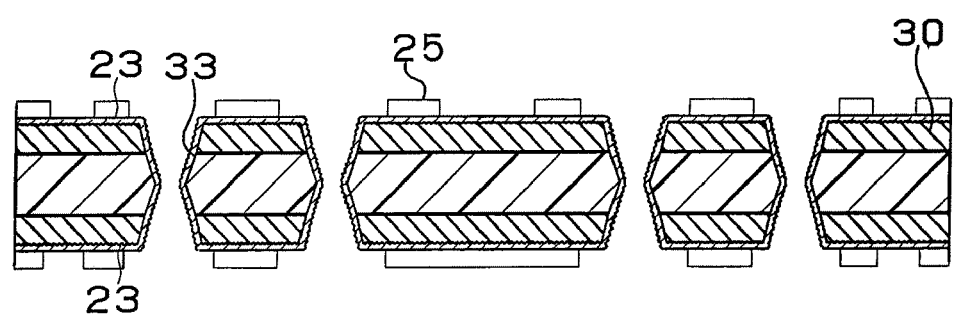
(C)
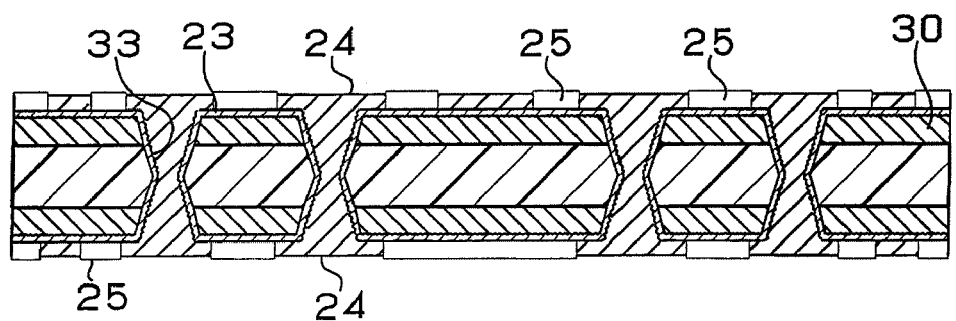

FIG. 9
(A)
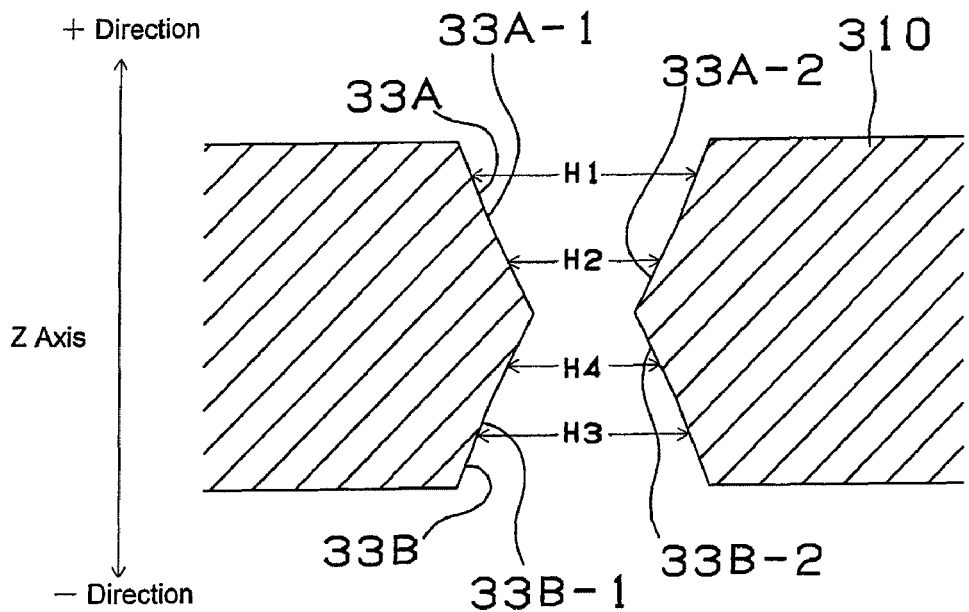
(B)
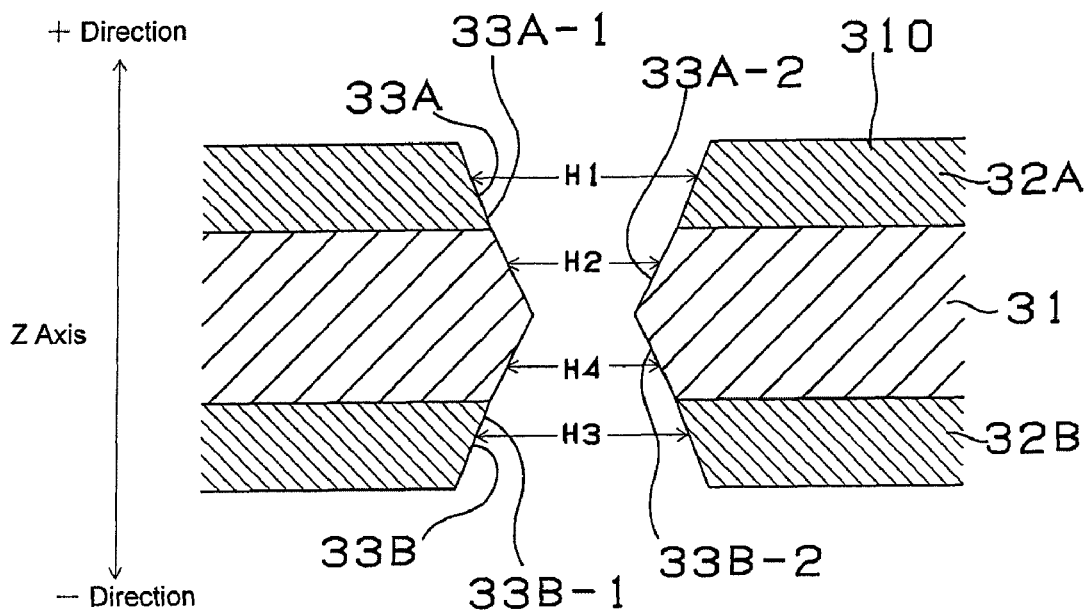

FIG. 11
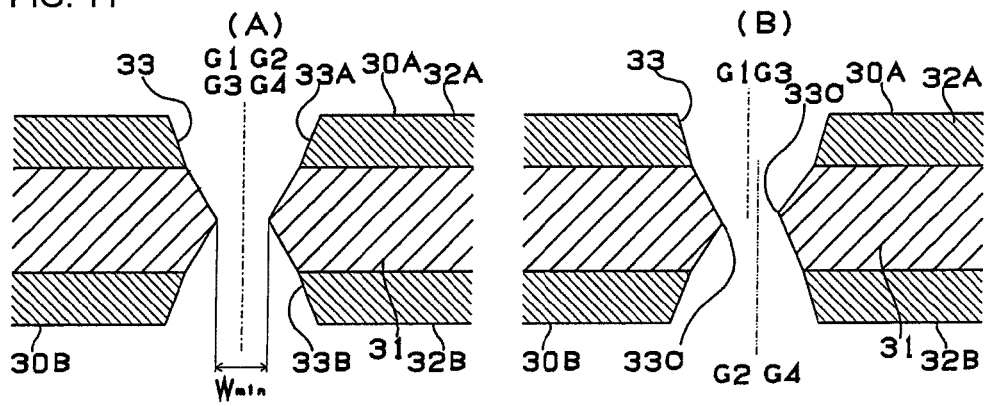
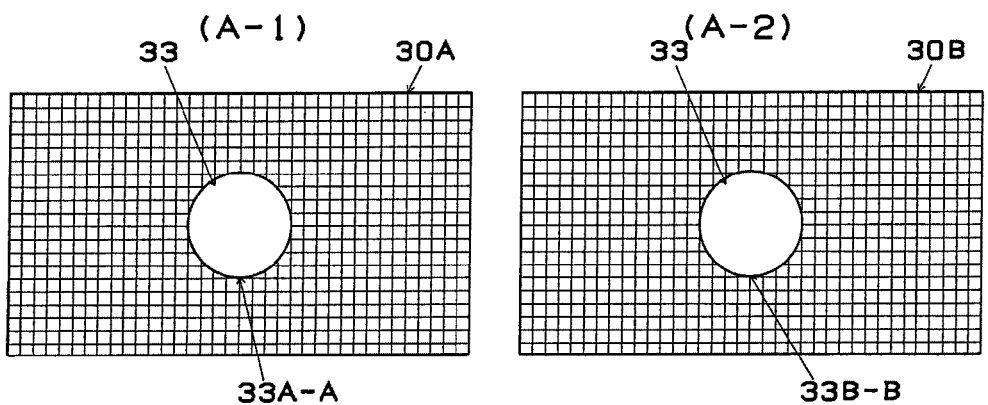
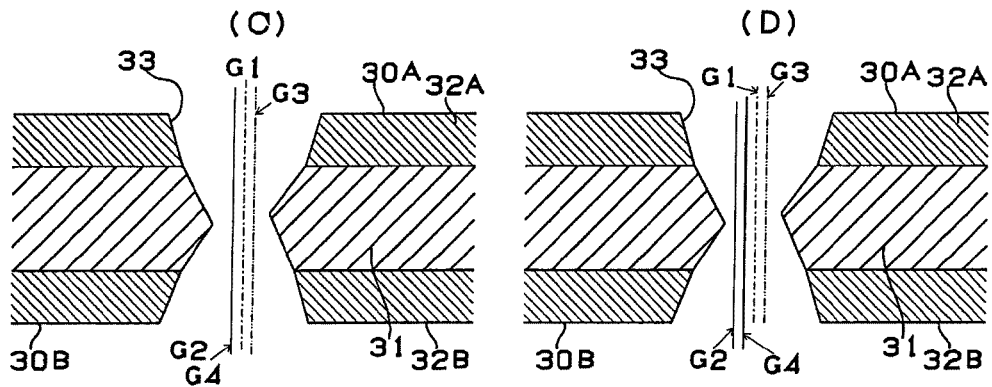

FIG. 15
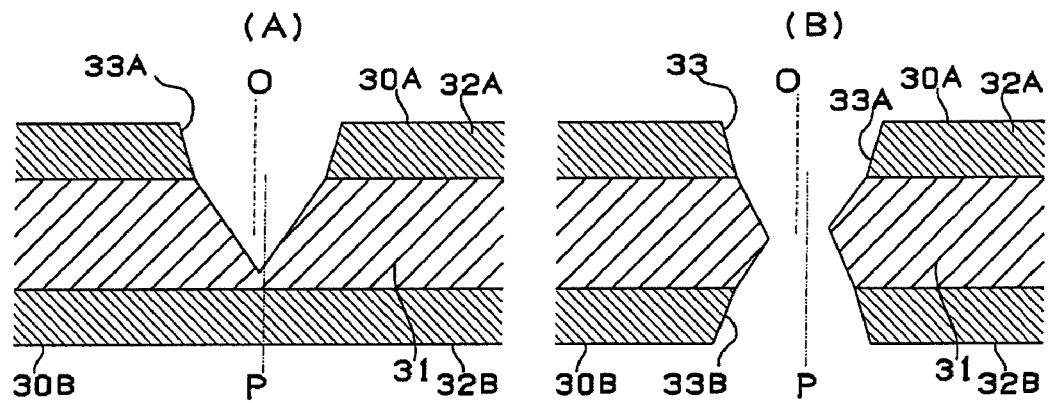
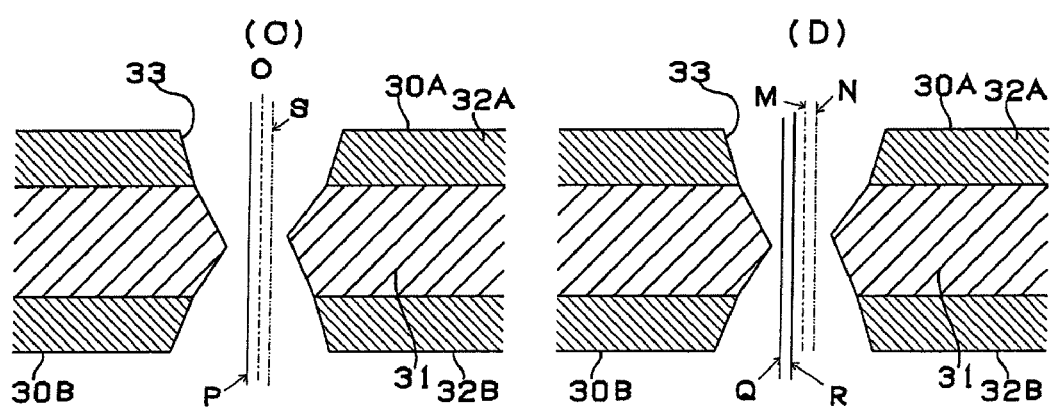

PRINTED WIRING BOARD AND METHOD FOR MANUFACTURING PRINTED WIRING BOARD

CROSS-REFERENCE TO RELATED APPLICATIONS

The present application claims the benefits of priority to U.S. Application No. 61/317,408, filed Mar. 25, 2010. The contents of that application are incorporated herein by reference in their entirety.

BACKGROUND OF THE INVENTION

1. Field of the Invention

The present invention relates to a printed wiring board and its manufacturing method. A printed wiring board of the present invention includes a core substrate having a penetrating hole made up of a first opening portion and a second opening portion, first circuit and second circuits formed on the core substrate, and a through-hole conductor formed in the penetrating hole and connecting the first and second circuits.

2. Discussion of the Background

Japanese Laid-Open Patent Publication 2006-41463 describes forming a penetrating hole made up of a first blind hole and a second blind hole in a dielectric layer. The penetrating hole in Japanese Laid-Open Patent Publication 2006-41463 is formed as an hourglass and is filled with conductive material. The contents of this publication are incorporated herein by reference in their entirety.

SUMMARY OF THE INVENTION

According to one aspect of the present invention, a printed wiring board includes a core substrate having a first surface and a second surface on the opposite side of the first surface, the core substrate having a penetrating hole penetrating through the core substrate between the first surface and the second surface, a first circuit formed on the first surface of the core substrate, a second circuit formed on the second surface of the core substrate, and a through-hole conductor formed in the penetrating hole of the core substrate and connecting the first circuit and the second circuit. The penetrating hole has a first opening portion and a second opening portion. The first opening portion of the penetrating hole becomes thinner from the first surface toward the second surface. The second opening portion of the penetrating hole becomes thinner from the second surface toward the first surface. The first opening portion has a first opening on the first surface of the core substrate and has a first portion including the first opening and a second portion contiguous to the first portion of the first opening portion. The second opening portion has a second opening on the second surface of the core substrate and has a first portion including the second opening and a second portion contiguous to the first portion of the second opening portion. The first portion and second portion of the first opening portion form inner walls of the first opening portion which bend inward with respect to the periphery of the penetrating hole at the boundary between the first portion and second portion of the first opening portion. The first portion and second portion of the second opening portion form inner walls of the second opening portion which bend inward with respect to the periphery of the penetrating hole at the boundary between the first portion and second portion of the second opening portion.

According to another aspect of the present invention, a method for manufacturing a printed wiring board includes preparing a core substrate having a first surface and a second surface on the opposite side of the first surface, forming a penetrating hole having a first opening portion and a second opening portion in the core substrate such that the first opening portion becomes thinner from the first surface of the core substrate toward the second surface and that the second opening portion becomes thinner from the second surface of the core substrate toward the first surface, forming a first circuit on the first surface of the core substrate, forming a second circuit on the second surface of the core substrate, and forming a plated film in the penetrating hole such that a through-hole conductor connecting the first circuit and the second circuit is formed. The first opening portion has a first opening on the first surface of the core substrate and has a first portion including the first opening and a second portion contiguous to the first portion of the first opening portion. The second opening portion has a second opening on the second surface of the core substrate and has a first portion including the second opening and a second portion contiguous to the first portion of the second opening portion. The first portion and second portion of the first opening portion form inner walls of the first opening portion which bend inward with respect to the periphery of the penetrating hole at the boundary between the first portion and second portion of the first opening portion. The first portion and second portion of the second opening portion form inner walls of the second opening portion which bend inward with respect to the periphery of the penetrating hole at the boundary between the first portion and second portion of the second opening portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 2(A) through 2(C) are views showing the steps of a method for manufacturing a multilayer printed wiring board according to the first embodiment;

FIG. 9 are views showing inner diameters of a penetrating hole in the first embodiment;

FIGS. 11(A), 11(B), 11(C) and 11(D) show penetrating holes in the first embodiment, (A-1) is a plan view showing a first surface of a core substrate in the first embodiment, and (A-2) is a plan view showing a second surface of the core substrate in the first embodiment;

FIG. 15 are views to illustrate the positions to irradiate laser beams; and

DETAILED DESCRIPTION OF THE EMBODIMENTS

Figure 1:
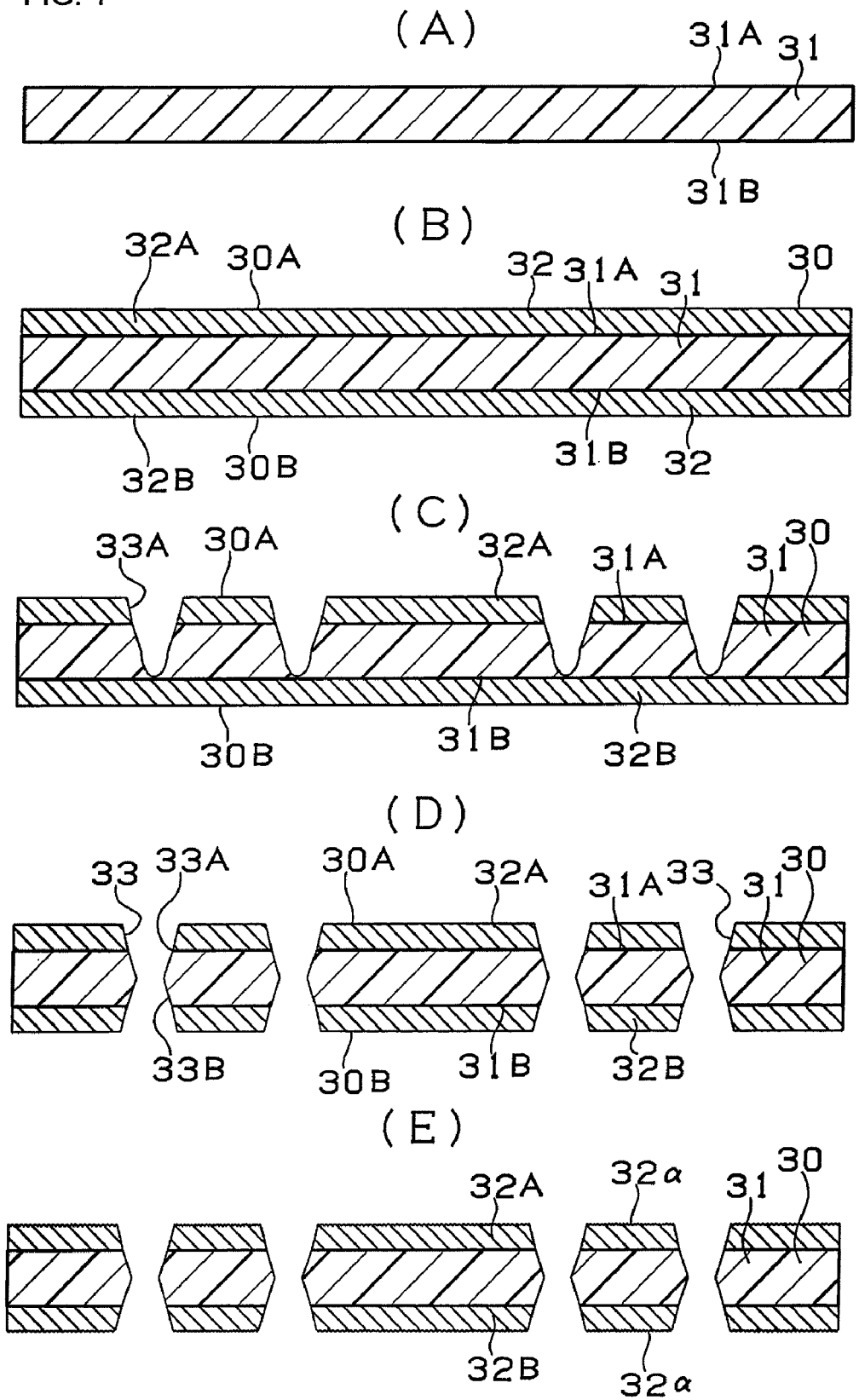
FIGS. 1(A) through 1(E) are views showing the steps of a method for manufacturing a multilayer printed wiring board according to the first embodiment.
Figure 3:
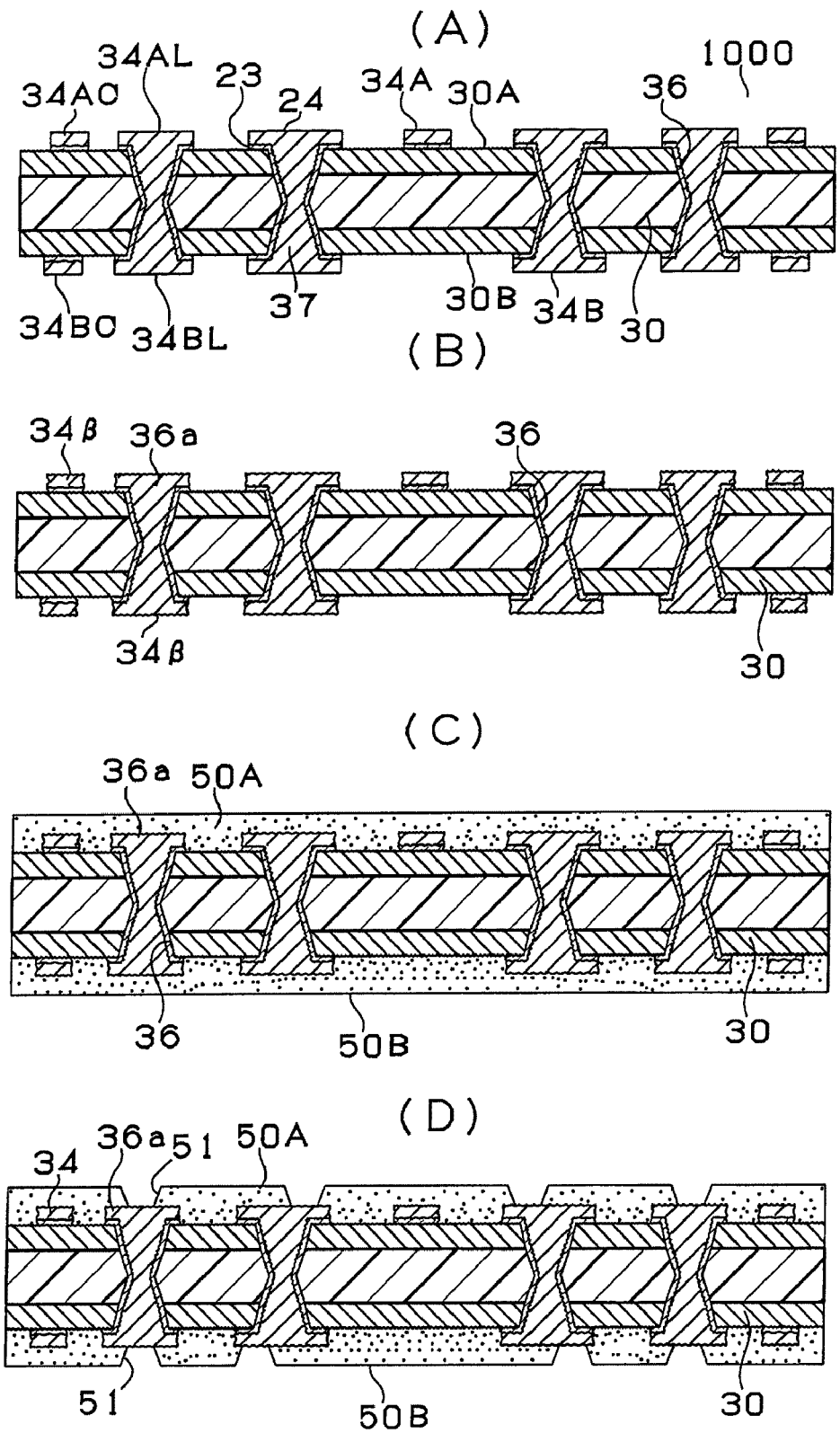
FIGS. 3(A) through 3(D) are views showing the steps of a method for manufacturing a multilayer printed wiring board according to the first embodiment.
Figure 4:
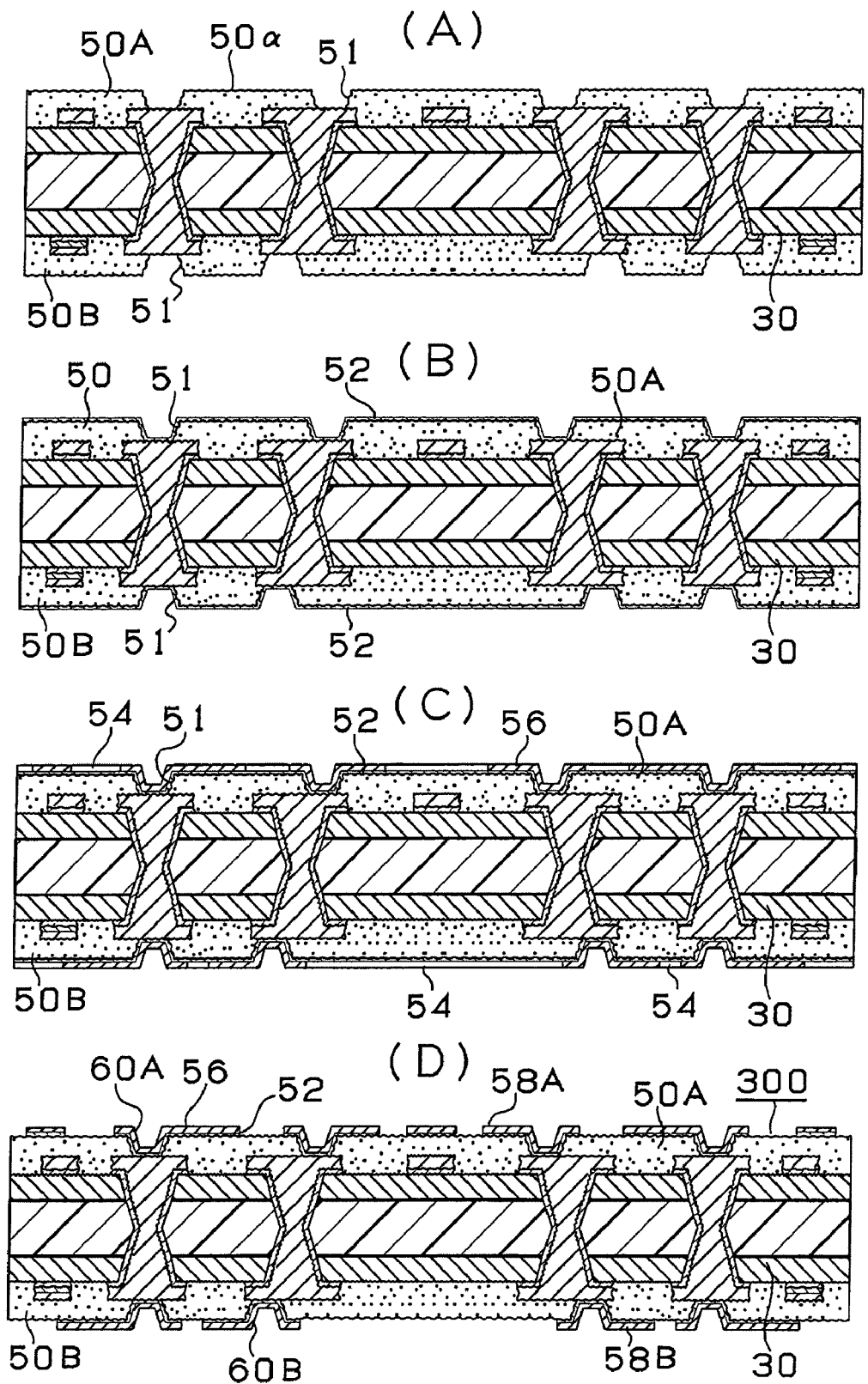
FIGS. 4(A) through 4(D) are views showing the steps of a method for manufacturing a multilayer printed wiring board according to the first embodiment.
Figure 5:
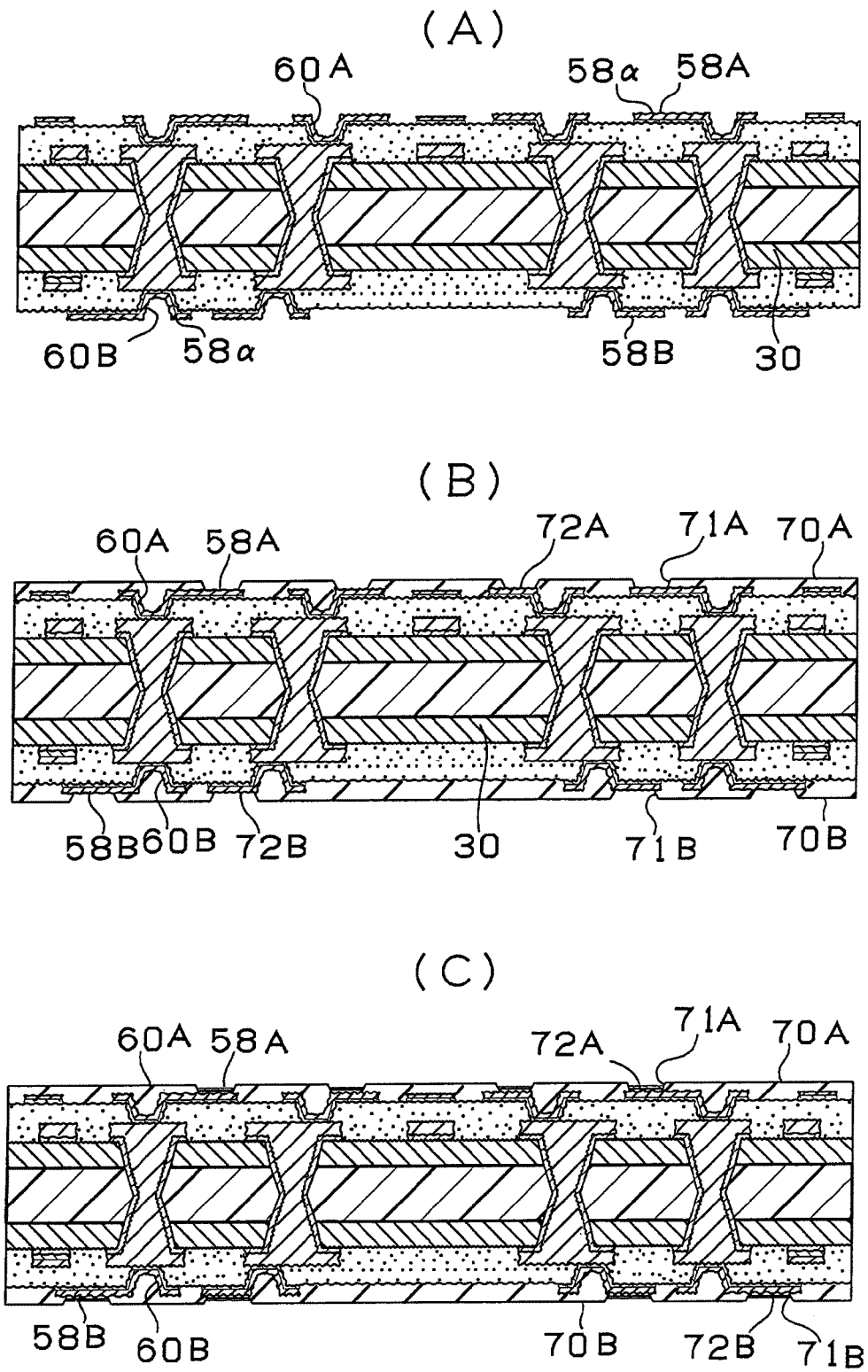
FIGS. 5 (A) through 5(C) are views showing the steps of a method for manufacturing a multilayer printed wiring board according to the first embodiment.

The embodiments will now be described with reference to the accompanying drawings, wherein like reference numerals designate corresponding or identical elements throughout the various drawings.

First Embodiment

Figure 6:
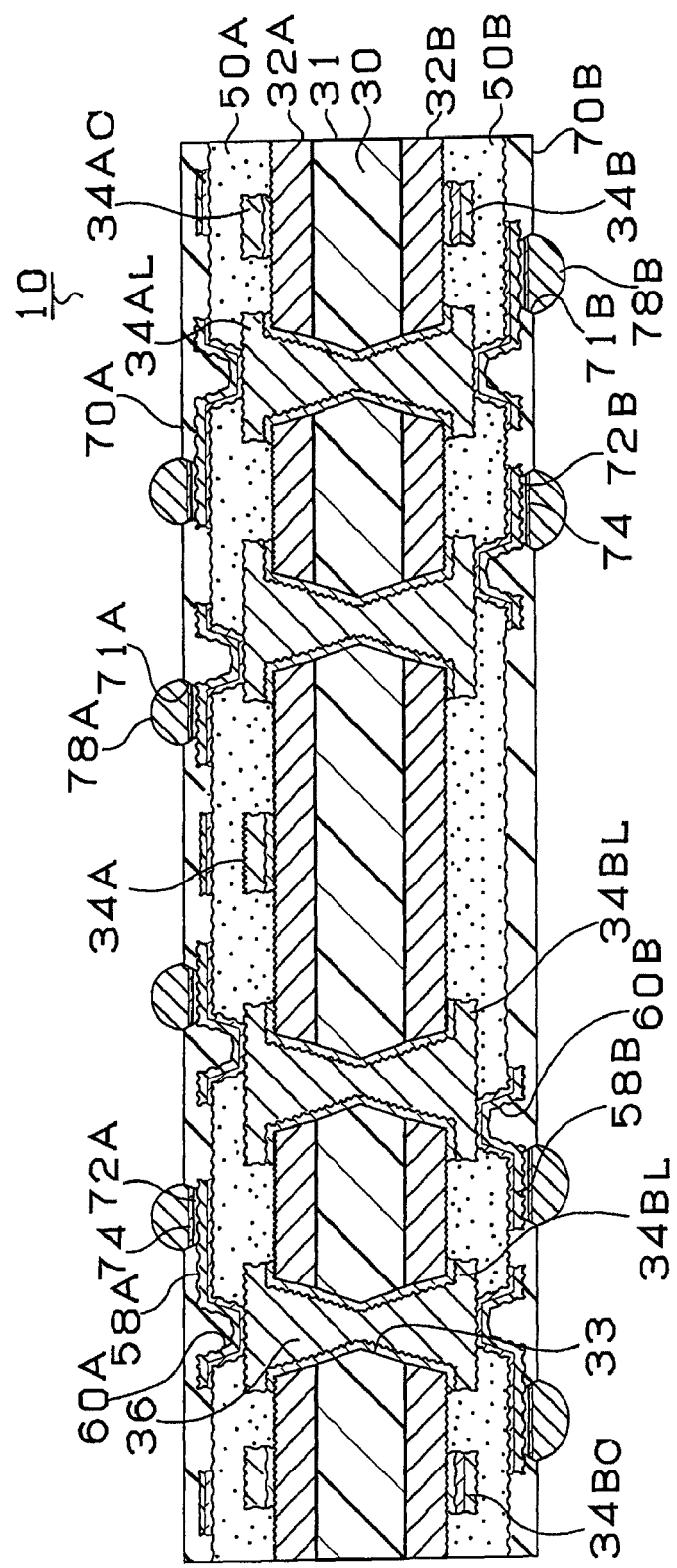
FIG. 6 is a cross-sectional view of a multilayer printed wiring board according to the first embodiment.

Multilayer printed wiring board 10 of the first embodiment is described with reference to FIG. 6. FIG. 6 shows a cross-sectional view of multilayer printed wiring board 10. In multilayer printed wiring board 10, first circuit (34A) is formed on a first surface of core substrate 30, and second circuit (34B) is formed on a second surface. First circuit (34A) has first conductive circuit (34AC) and first land (34AL), and second circuit (34B) has second conductive circuit (34BC) and second land (34BL). The first conductive circuit and the second conductive circuit are connected by through-hole conductor 36. The first land and the second land are connected by through-hole conductor 36. Upper-layer first interlayer resin insulation layer (50A) is formed on the first surface of core substrate 30 and on the first circuit. Upper-layer first interlayer resin insulation layer (50A) has a first surface and a second surface opposite the first surface. The second surface of upper-layer first interlayer resin insulation layer (50A) faces the first surface of the core substrate. Conductive circuit (58A) is formed on the first surface of upper-layer first interlayer resin insulation layer (50A). Conductive circuit (58A) on upper-layer first interlayer resin insulation layer (50A) and the first circuit or the through-hole conductor are connected by via conductor (60A), which penetrates through upper-layer first interlayer resin insulation layer (50A).

Lower-layer first interlayer resin insulation layer (50B) is formed on the second surface of core substrate 30 and on the second circuit. Lower-layer first interlayer resin insulation layer (50B) has a first surface and a second surface opposite the first surface. The second surface of lower-layer first interlayer resin insulation layer (50B) faces the second surface of the core substrate. Conductive circuit (58B) is formed on the first surface of lower-layer first interlayer resin insulation layer (50B). Conductive circuit (58B) on lower-layer first interlayer resin insulation layer (50B) and the second circuit or the through-hole conductor are connected by via conductor (60B), which penetrates through lower-layer first interlayer resin insulation layer (50B).

Upper-layer solder-resist layer (70A) is formed on the first surface of upper-layer first interlayer resin insulation layer (50A), and lower-layer solder-resist layer (70B) is formed on the first surface of lower-layer first interlayer resin insulation layer (50B). Upper and lower solder-resist layers (70A, 70B) have openings (71A, 71B) that expose via conductors (60A, 60B) and conductive circuits (58A, 58B). Top surfaces of the via conductors and the conductive circuits exposed through openings (71A, 71B) function as solder pads (72A, 72B). Solder bumps (78A, 78B) are formed on solder pads (72A, 72B).

A magnified view of through-hole conductor 36 formed in core substrate 30 in FIG. 6 is shown in FIG. 10(B).

Core substrate 30 has insulative substrate 31 having main surface (31A) and secondary surface (31B) opposite the main surface, first resin insulation layer (32A) formed on the main surface of insulative substrate 31, and second resin insulation layer (32B) formed under the secondary surface. Core substrate 30 has penetrating hole 33 which penetrates through the core substrate. First resin insulation layer (32A) has a front surface and a back surface opposite the front surface, and the back surface faces the main surface. Second resin insulation layer (32B) has an upper surface and a lower surface opposite the upper surface, and the upper surface faces the secondary surface. The core substrate has a first surface and a second surface opposite the first surface; and the first surface corresponds to the front surface and the second surface corresponds to the lower surface. Insulative substrate 31 is preferred to contain a reinforcing material, but the first resin insulation layer (32A) and second resin insulation layer (32B) are preferred not to contain a reinforcing material. As for a reinforcing material, glass cloth, aramid fiber or the like may be used. First and second resin insulation layers (32A, 32B) may contain inorganic fillers such as silica and alumina. Through-hole conductor 36 is made of the plated metal filled in penetrating hole 33. FIG. 11 show penetrating hole 33 for a through-hole conductor. Penetrating hole 33 has first opening portion (33A) formed by irradiating a laser from first surface (30A) of core substrate 30, and second opening portion (33B) formed by irradiating a laser from second surface (30B) of the core substrate. FIG. 11(A-1) is a plan view of the first surface of the core substrate, and FIG. 11(A-2) is a plan view of the second surface of the core substrate. First opening portion (33A) has first opening (33A-A) on the first surface of the core substrate, and second opening portion (33B) has second opening (33B-B) on the second surface of the core substrate. First opening portion (33A) and second opening portion (33B) are joined inside insulative substrate 31. First opening portion (33A) becomes thinner from the first surface of the core substrate toward the second surface; and second opening portion (33B) becomes thinner from the second surface of the core substrate toward the first surface. FIG. 11 are cross-sectional views obtained by slicing penetrating hole 33 with a plane which passes through the gravity center of the first opening and includes a straight line (first gravity line) (G1) perpendicular to the first surface of the core substrate. As shown in FIG. 11, the inner walls of the first opening portion bend inward at the interface of the first resin insulation layer and the insulative substrate; and the inner walls of the second opening portion bend inward at the interface of the second resin insulation layer and the insulative substrate. Such bending directions indicate directions toward the first gravity line.

A straight line passing through the gravity center of the first opening and perpendicular to the first surface of the core substrate may be offset from a straight line (second gravity line) (G2) passing through the gravity center of the second opening and perpendicular to the first surface of the core substrate (FIG. 11(B)). The first gravity line and the second gravity line are not required to overlap. In such a case, it is easier to fill a penetrating hole with plating. The area where a first opening portion and a second opening portion are connected increases, and the connection reliability of the through-hole conductor is enhanced.

Figure 7:
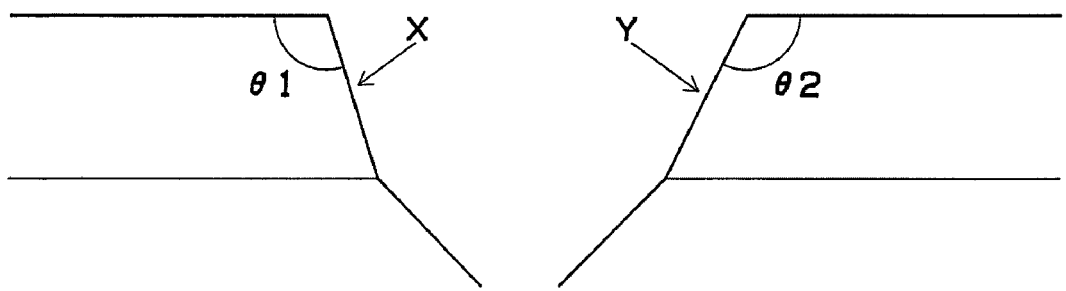
FIG. 7 is a view showing angles between a first surface of a core substrate and inner walls of a penetrating hole.

The first opening portion has a third opening at the junction of the (first-1) opening portion and the (first-2) opening portion. The second opening portion has a fourth opening at the junction of the (second-1) opening portion and the (second-2) opening portion. A straight line (the third gravity line) (G3) passing through the gravity center of the third opening and perpendicular to the first surface of the core substrate may be offset from the first gravity line. The first gravity line and the third gravity line are not required to overlap. A straight line (fourth gravity line) (G4) passing through the gravity center of the fourth opening and perpendicular to the first surface of the core substrate may be offset from the second gravity line. The second gravity line and the fourth gravity line are not required to overlap. Penetrating hole 33 tends to fill with plating film, and voids are less likely to occur in the through-hole conductor. The reliability of the through-hole conductor increases. FIG. 7 shows a cross-sectional view of a penetrating hole obtained in a case where the first gravity line and the third gravity line are offset. Inner walls (X, Y) facing each other in a penetrating hole make different angles ($\theta1$, $\theta2$) to the first surface of the core substrate. When a penetrating hole is filled with plated film, the penetrating hole is gradually filled with plated film starting from inner wall X and inner wall Y. If angle ($\theta1$) formed between inner wall X and the first surface of the core substrate is different from angle ($\theta2$) formed between inner wall Y and the first surface of the core substrate, it is thought that the plating solution supplied into the penetrating hole along the plated film on inner wall X and the plating solution supplied into the penetrating hole along the plated film on inner wall Y enters the penetrating hole from different directions. Also, it is thought that the plating solution is supplied into the penetrating hole from different directions. The plating solution in the penetrating hole tends to circulate, and the penetrating hole tends to be filled with plating. When a penetrating hole is filled with electrolytic plated film, since deposition speed is fast in electrolytic plating, voids tend to occur in the electrolytic plated film. However, when the first gravity line and the third gravity line are offset, since the plating solution in the opening portion tends to circulate, the first opening portion tends to fill with plated film. In the same manner, when the second gravity line and the fourth gravity line are offset, the second opening portion tends to fill with plated film.

The first, second, third and fourth gravity lines may all be offset from each other. It is not required that the first, second, third and fourth gravity lines all overlap. The same effects are achieved as above.

When a core substrate is formed with an insulative substrate and with a first resin insulation layer and a second resin insulation layer sandwiching the insulative substrate, the third opening tends to be formed on the interface of the insulative substrate and the first resin insulation layer, and the fourth opening tends to be formed on the interface of the insulative substrate and the second resin insulation layer.

A first opening portion is made up of (first-1) opening portion (33A-1) and (first-2) opening portion (33A-2). When the degree at which the (first-1) opening portion becomes thinner from the first surface of the core substrate toward the second surface is ($\Delta W1$), and the degree at which the (first-2) opening portion becomes thinner from the first surface of the core substrate toward the second surface is ($\Delta W2$), ($\Delta W1$) is set smaller than ($\Delta W2$). Also, a second opening portion is made up of (second-1) opening portion (33B-1) and (second-2) opening portion (33B-2). When the degree at which (second-1) opening portion (33B-1) becomes thinner from the second surface of the core substrate toward the first surface is ($\Delta W3$), and the degree at which the (second-2) opening portion becomes thinner from the second surface of the core substrate toward the first surface is ($\Delta W4$), ($\Delta W3$) is set smaller than ($\Delta W4$).

When a core substrate is formed with an insulative substrate and with a first resin insulation layer and a second resin insulation layer sandwiching the insulative substrate, a (first-1) opening portion is likely formed in the first resin insulation layer, a (first-2) opening portion and a (second-2) opening portion is likely formed in the insulative substrate, and a (second-1) opening portion is likely formed in the second resin insulation layer. In such situations, ($\Delta W1$) is the degree at which the (first-1) opening portion becomes thinner from the front surface of the first resin insulation layer toward the back surface; ($\Delta W2$) is the degree at which the (first-2) opening portion becomes thinner from the main surface of the insulative substrate toward the secondary surface; ($\Delta W4$) is the degree at which the (second-2) opening portion becomes thinner from the secondary surface of the insulative substrate toward the main surface; and ($\Delta W3$) is the degree at which the (second-1) opening portion becomes thinner from the lower surface of the second resin insulation layer toward the upper surface.

Accordingly, diameter (Wmin) tends to be enlarged at portion (junction) (33c) where the first opening portion joins the second opening portion. In addition, diameters of first opening (33A-A) and second opening (33B-B) may be set smaller. Diameter (Wmin) indicates the minimum diameter of a penetrating hole, corresponding to "Wmin" in FIG. 11. "Wmin" in FIG. 11 is the distance between the portions where the first opening portion intersects the second opening portion. Since the minimum diameter of a penetrating hole is enlarged in the first embodiment, cracks seldom occur at junction (33c) in the through-hole conductor. In addition, the diameter of the first opening and the diameter of the second opening may be set smaller. The greater of the diameter of the first opening and the diameter of the second opening is set as the diameter of the penetrating hole. While preventing a decrease in the reliability of through-hole conductors when their diameters become smaller, through-hole conductors are arranged at high density.

FIG. 8(A) shows a penetrating hole of a reference example. In the reference example, the inner walls of first opening portion (333A) change in a straight line. The inner walls of second opening portion (333B) change in a straight line as well. In FIG. 8(B), a penetrating hole of the first embodiment overlaps a penetrating hole of the reference example. The inner walls of the reference example are drawn using a solid line, and parts of the inner walls of the first embodiment are drawn using a broken line. In the first embodiment, a first opening portion is made up of a (first-1) opening portion and a (first-2) opening portion, and the inner walls of the first opening portion bend at predetermined spots (a, b). The inner walls of the (first-1) opening portion range from the first surface of the core substrate to bent portions (a, b). The inner walls of the (first-1) opening portion are drawn using broken line "Z." The inner walls of the (first-2) opening portion range from bent portions (a, b) to bent portions (c, d). The inner walls of the reference example overlap the inner walls of the (first-2) opening portion in the first embodiment (see FIG. 8(B)). The first opening portion bends toward the inside of the penetrating hole at the boundary between the (first-1) opening portion and the (first-2) opening portion. The inner walls of a second opening portion bend at predetermined spots (e, f). The inner walls of the (second-1) opening portion range from the second surface of the core substrate to bent portions (e, f).

The inner walls of the (second-1) opening portion are drawn using broken line "V." The inner walls of the (second-2) opening portion range from bent portions (e, f) to bent portions (c, d). The inner walls of the reference example overlap the inner walls of the (second-2) opening portion in the first embodiment (see FIG. 8(B)). The second opening portion bends toward the inside of the penetrating hole at the boundary between the (second-1) opening portion and the (second-2) opening portion.

As shown in FIG. 8(B), if the minimum diameter (Wmin) of a penetrating hole is the same in the reference example and in the first embodiment, diameter (W2) of first opening (33A-A) in the first embodiment is set smaller than diameter (W1) of the first opening in the reference example; and diameter (W3) of second opening (33B-B) in the first embodiment is set smaller than diameter (W4) of the second opening in the reference example. Even if the minimum diameter of a penetrating hole in the reference example is the same as the minimum diameter of a penetrating hole in the first embodiment, diameter (WW) of a penetrating hole in the first embodiment is set smaller than the diameter of a penetrating hole in the reference example. The greater of W2 and W3 is set as diameter (WW) of the penetrating hole. Therefore, in the first embodiment, the diameter of a through-hole conductor (the diameter of a penetrating hole) may be set smaller than that of the reference example. Through-hole conductors may be set at a smaller pitch in the first embodiment than those in the reference example. The core substrate may be formed smaller in the first embodiment. The reliability of through-hole conductors in the first embodiment is better than the reliability of through-hole conductors in the reference example.

When the first embodiment and the reference example are compared, since the ratio of diameter (WW) of penetrating hole 33 to minimum diameter (Wmin) (Wmin/WW) is greater in the first embodiment, the reliability of a through-hole conductor is enhanced against core substrate warping or the like that is caused by thermal contraction.

In FIG. 8(C), a penetrating hole of the first embodiment overlaps a penetrating hole of the reference example. The inner walls in the reference example are drawn using a broken line, and the inner walls of the first embodiment are drawn using a solid line. First opening portion (33A) of the first embodiment is made up of the (first-1) opening portion and the (first-2) opening portion, and the inner walls of the first opening portion bend at predetermined spots. The inner walls of the (first-1) opening portion are drawn using solid line "Z'." The inner walls of second opening portion (33B) bend at predetermined spots. The inner walls of the (second-1) opening portion are drawn using solid line "V'." As shown in FIG. 8(C), if diameter (W1) of the first opening of a penetrating hole is the same in the reference example and the first embodiment, minimum diameter (D1) of a penetrating hole in the first embodiment is greater than minimum diameter (D2) of a penetrating hole in the reference example. Namely, in the first embodiment, since the minimum diameter of a penetrating hole is enlarged relative to the diameter of the first opening, the first opening portion and the second opening portion is joined highly accurately. In addition, since the minimum diameter of a penetrating hole is enlarged, warping in a printed wiring board is suppressed. Furthermore, the reliability of the through-hole conductor filled in a penetrating hole is enhanced.

FIG. 9 are cross-sectional views obtained by slicing a core substrate with a plane that includes the first gravity line. The arrow indicated to the left of the core substrate is axis Z, which is perpendicular to the first surface of the core substrate. The plus direction goes upward and the minus direction goes downward. In FIG. 9(A), the core substrate is made of one material. As shown in FIG. 9(A), in the first embodiment, first opening portion (33A) is made up of (first-1) opening portion (33A-1) and (first-2) opening portion (33A-2); and second opening portion (33B) is made up of (second-1) opening portion (33B-1) and (second-2) opening portion (33B-2). A penetrating hole is formed by the first opening portion and the second opening portion which are joined inside the core substrate. The (first-1) opening portion is an opening portion that includes the first opening, and the (first-2) opening portion is an opening portion that is contiguous to the (first-1) opening portion in the core substrate. The (second-1) opening portion is an opening portion that includes the second opening, and the (second-2) opening portion is an opening portion that is contiguous to the (second-1) opening portion in the core substrate. The inner walls of the first opening portion bend in the direction of the first gravity line at the boundary between the (first-1) opening portion and the (first-2) opening portion. The inner walls of the second opening portion bend in the direction of the first gravity line at the boundary between the (second-1) opening portion and the (second-2) opening portion. The first opening portion, the (first-1) opening portion and the (first-2) opening portion become gradually thinner from the first surface of the core substrate toward the second surface. When the degree at which the (first-1) opening portion becomes thinner is ($\Delta$W1), and the degree at which the (first-2) opening portion becomes thinner is ($\Delta$W2), ($\Delta$W2) is set greater than ($\Delta$W1). ($\Delta$W1) and ($\Delta$W2) are the degrees at which the (first-1) opening portion and the (first-2) opening portion become thinner in the minus direction along axis Z.

(H1) in FIG. 9(A) is the inner diameter of (first-1) opening portion (33A-1), and is the distance between the inner walls facing each other at predetermined spots in the (first-1) opening portion. The value of (H1) decreases from the first surface of the core substrate toward the second surface (the value of (H1) decreases in the minus direction along axis Z). The amount of change is ($\Delta$H1). (H2) in FIG. 9(A) is the inner diameter of (first-2) opening portion (33A-2), and is the distance between the inner walls facing each other at predetermined spots in the (first-2) opening portion. The value of (H2) decreases from the first surface of the core substrate toward the second surface (the value of (H2) decreases in the minus direction along axis Z). The amount of change is ($\Delta$H2). ($\Delta$H2) is set greater than ($\Delta$H1).

Second opening portion (33B), (second-1) opening portion (33B-1) and (second-2) opening portion (33B-2) become gradually thinner from the second surface of the core substrate toward the first surface. When the degree at which the (second-1) opening portion becomes thinner is ($\Delta$W3), and the degree at which the (second-2) opening portion becomes thinner is ($\Delta$W4), ($\Delta$W4) is set greater than ($\Delta$W3). ($\Delta$W3) and ($\Delta$W4) are the degrees at which the (second-1) opening portion and the (second-2) opening portion become thinner in the plus direction along axis Z.

(H3) in FIG. 9(A) is the inner diameter of (second-1) opening portion (33B-1), and is the distance between the inner walls facing each other at predetermined spots in the (second-1) opening portion. The value of (H3) decreases from the second surface of the core substrate toward the first surface (the value of (H3) decreases in the plus direction along axis Z). The amount of change is ($\Delta$H3). (H4) in FIG. 9(A) is the inner diameter of (second-2) opening portion (33B-2), and is the distance between the inner walls facing each other at predetermined spots in the (second-2) opening portion. The value of (H4) decreases from the second surface of the core substrate toward the first surface (the value of (H4) decreases in the plus direction along axis Z). The amount of change is (ΔH4). (ΔH4) is set greater than (ΔH3).

FIG. 9(B) shows an example in which a core substrate is made up of an insulative substrate and of resin insulation layers sandwiching the insulative substrate. A (first-1) opening portion is an opening that penetrates through a first resin insulation layer, and a (first-2) opening portion is an opening formed in the main-surface side of the insulative substrate. The (first-1) opening portion becomes gradually thinner from the front surface of the first resin insulation layer toward the back surface with a degree of (ΔW1). The (first-2) opening portion becomes gradually thinner from the main surface of the insulative substrate toward the secondary surface with a degree of (ΔW2). (ΔW2) is set greater than (ΔW1). (ΔW1) and (ΔW2) are the degrees at which the (first-1) opening portion and the (first-2) opening portion become thinner in the minus direction along axis Z. (H1) in FIG. 9(B) is the inner diameter of the (first-1) opening portion, and is the distance between the inner walls facing each other at predetermined spots in the (first-1) opening portion. The value of (H1) decreases from the front surface of the first resin insulation layer toward the back surface (the value of (H1) decreases in the minus direction along axis Z). (H2) in FIG. 9(B) is the inner diameter of the (first-2) opening portion, and is the distance between the inner walls facing each other at predetermined spots in the (first-2) opening portion. The value of (H2) decreases from the main surface of the insulative substrate toward the secondary surface (the value of (H2) decreases in the minus direction along axis Z). A (second-1) opening portion is an opening that penetrates through a second resin insulation layer, and a (second-2) opening portion is an opening formed in the secondary-surface side of the insulative substrate. The (second-1) opening portion becomes gradually thinner from the lower surface of the second resin insulation layer toward the upper surface with a degree of (ΔW3). The (second-2) opening portion becomes gradually thinner from the secondary surface of the insulative substrate toward the main surface with a degree of (ΔW4). (ΔW4) is set greater than (ΔW3). (ΔW3) and (ΔW4) are the degrees at which the (second-1) opening portion and the (second-2) opening portion become thinner in the plus direction along axis Z. (H3) in FIG. 9(B) is the inner diameter of the (second-1) opening portion, and is the distance between the inner walls facing each other at predetermined spots in the (second-1) opening portion. The value of (H3) decreases from the lower surface of the second resin insulation layer toward the upper surface (the value of (H3) decreases in the plus direction along axis Z). The amount of change is (ΔH3). (H4) in FIG. 9(B) is the inner diameter of the (second-2) opening portion, and is the distance between the inner walls facing each other at predetermined spots in the (second-2) opening portion. The value of (H4) decreases from the secondary surface of the insulative substrate toward the main surface (the value of (H4) decreases in the plus direction along axis Z). The amount of change is (ΔH4). (ΔH4) is set greater than (ΔH3).

Since the value of (ΔW1) is different from that of (ΔW2) in the first opening portion, the first opening portion bends at the boundary between the (first-1) opening portion and the (first-2) opening portion. In the same manner, since the value of (ΔW3) is different from that of (ΔW4) in the second opening portion, the second opening portion bends at the boundary between the (second-1) opening portion and the (second-2) opening portion.

Since the value of (ΔH1) is different from that of (ΔH2) in the first opening portion, the first opening portion bends at the boundary between the (first-1) opening portion and the (first-2) opening portion. In the same manner, since the value of (ΔH3) is different from that of (ΔH4) in the second opening portion, the second opening portion bends at the boundary between the (second-1) opening portion and the (second-2) opening portion.

When forming opening portions under the same conditions using a laser in an insulative substrate and resin insulation layers that form a core substrate, forming opening portions in resin insulation layers is preferred to be carried out more easily than forming opening portions in the insulative substrate. A first opening portion and a second opening portion with bent portions may be formed more easily than a core substrate that is formed with one material (FIG. 9(A)).

Figure 8:
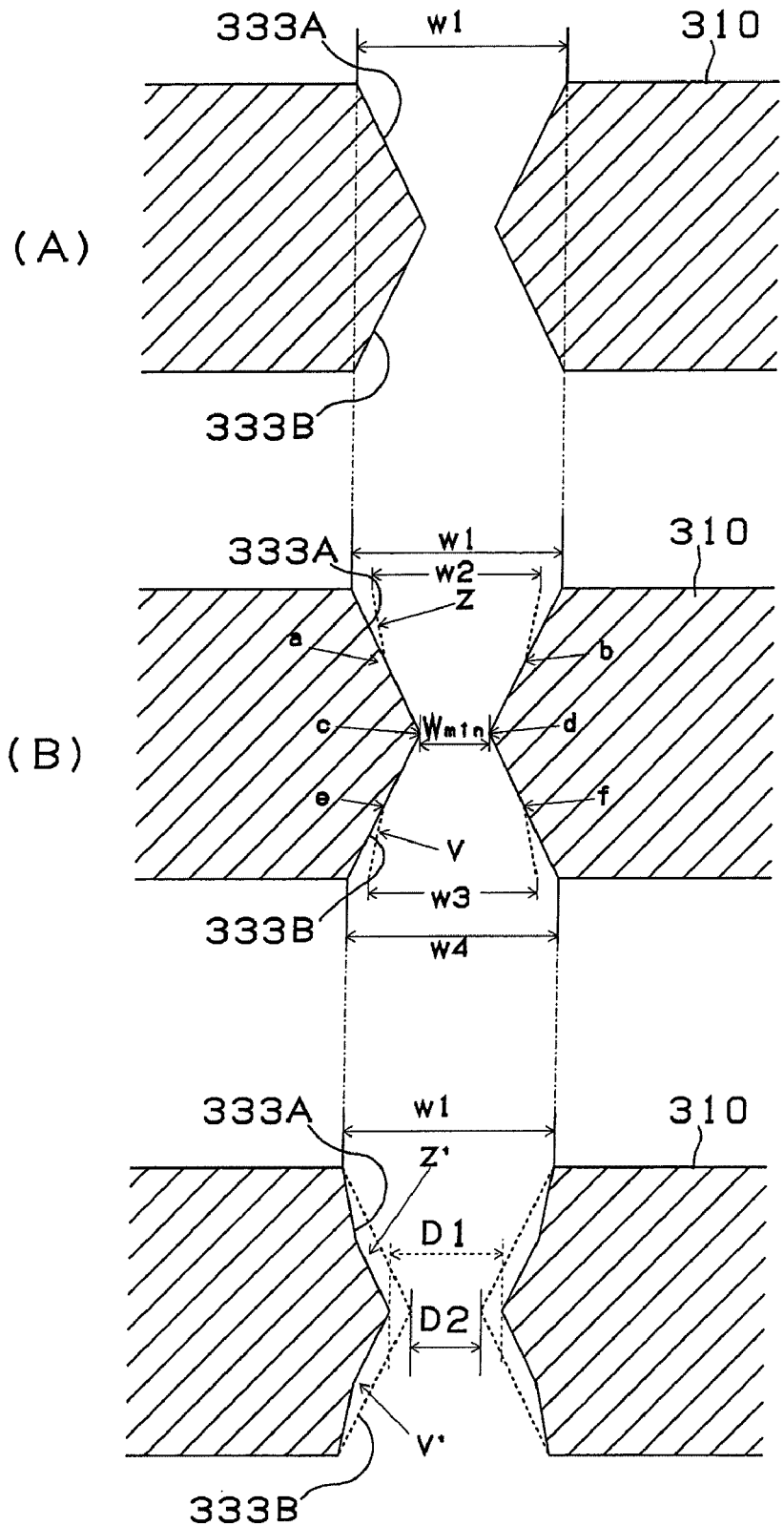
FIG. 8 are views showing cross sections of penetrating holes in a reference example and in the first embodiment.
Figure 10:
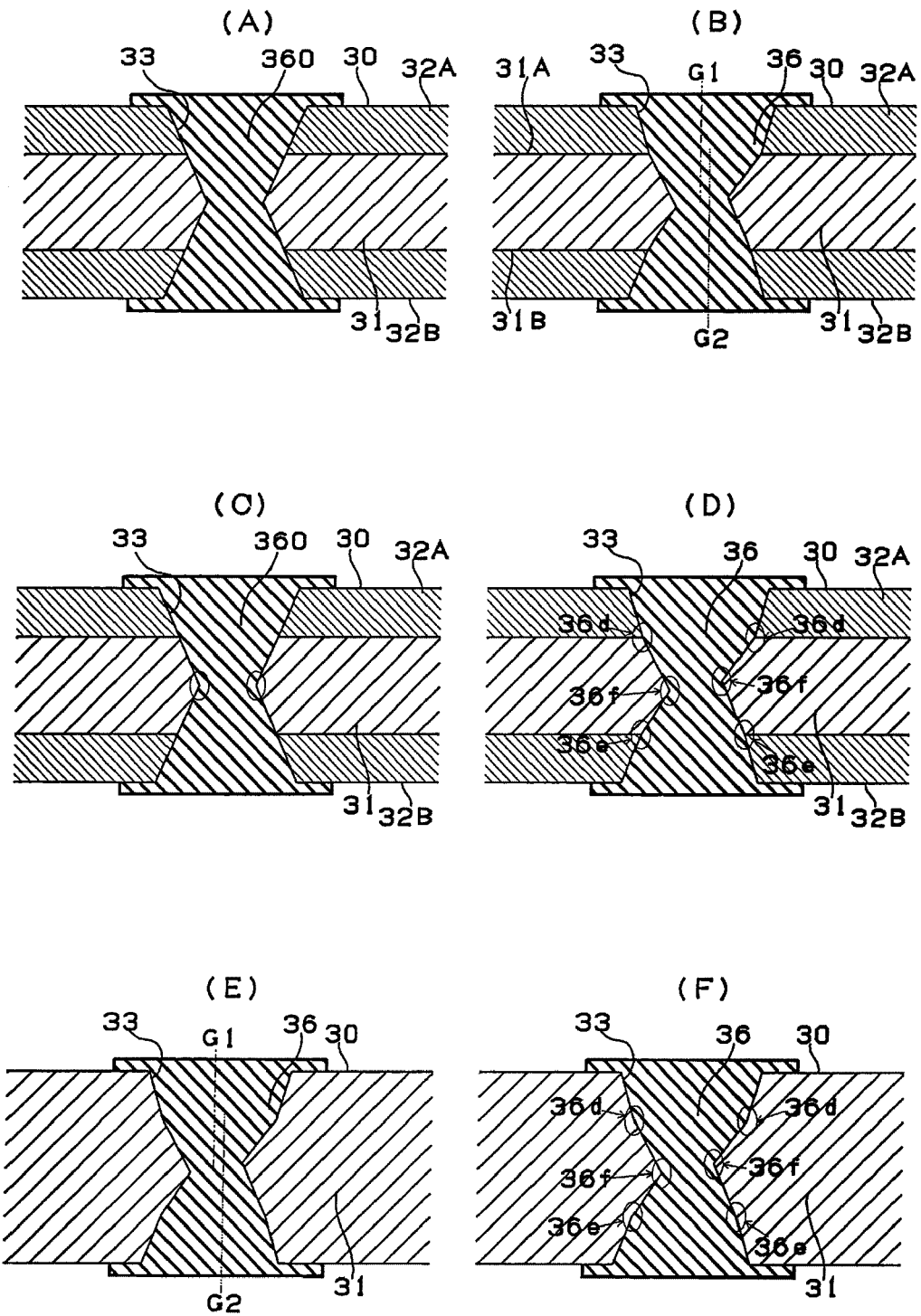
FIGS. 10(A) and 10(C) show a through-hole conductor in a reference example.
FIGS. 10(B), 10(D), 10(E) and 10(F) show through-hole conductors in the first embodiment.

FIG. 10 show through-hole conductors obtained by filling conductor in penetrating holes in the first embodiment and the reference example (FIGS. 8, 9). FIG. 10(A) shows through-hole conductor 360 of the reference example, and FIGS. 10(B) and 10(E) show through-hole conductors of the first embodiment. In FIGS. 10(B) and 10(E), a first gravity line and a second gravity line are offset. A core substrate in FIG. 10(B) is made up of an insulative substrate and of a first resin insulation layer and a second resin insulation layer sandwiching the insulative substrate. A core substrate in FIG. 10(E) is made of one material. As a conductor for filling a penetrating hole, plated-metal film and conductive paste may be used. As for such plated metal film, electrolytic plated film and electroless plated film may be listed. As for such a through-hole conductor, a metal made of a seed layer formed on the inner walls of a penetrating hole and of an electrolytic plated film on the seed layer is preferred. Such electrolytic plated film fills the penetrating hole. As for a seed layer, sputtered film and electroless plated film may be listed. Through-hole conductor 36 of the first embodiment is made of conductors filled in a (first-1) opening portion, a (first-2) opening portion, a (second-1) opening portion and a (second-2) opening portion. The conductor filled in the (first-1) opening portion becomes thinner from the first surface of the core substrate toward the second surface with a degree of (δ1). The conductor filled in the (first-2) opening portion becomes thinner from the first surface of the core substrate toward the second surface with a degree of (δ2). Since the value of (δ1) is different from that of (δ2), the through-hole conductor bends in the core substrate. Accordingly, the through-hole conductor in the first opening portion contains bent portion (36d). The conductor filled in the (second-1) opening portion becomes thinner from the second surface of the core substrate toward the first surface with a degree of (δ4). The conductor filled in the (second-2) opening portion becomes thinner from the second surface of the core substrate toward the first surface with a degree of (δ3). Since the value of (δ3) is different from that of (δ4), the through-hole conductor bends in the core substrate. Accordingly, the through-hole conductor in the second opening portion contains bent portion (36e). If a core substrate is made of an insulative substrate and of a first resin insulation layer and a second resin insulation layer sandwiching the insulative substrate, bent portion (36d) is positioned at the interface of the first resin insulation layer and the insulative substrate, and bent portion (36e) is positioned at the interface of the second resin insulation layer and the insulative substrate. Furthermore, the through-hole conductor of the first embodiment contains bent portion (36f) at the junction of the first opening portion and the second opening portion. By contrast, the reference example has neither a (first-2) opening portion nor a (second-2) opening portion. Thus, a through-hole conductor of the reference example contains a bent portion at the junction of a first opening portion and a second opening portion, but does not contain a bent portion at the boundary between a (first-1) opening portion and a (first-2) opening portion or at the boundary between a (second-1) opening portion and a (second-2) opening portion. FIGS. 10(C), (D) and (F) show portions where through-hole conductors bend. Circled portions are bent portions. FIG. 10(C) shows through-hole conductor 360 of the reference example, and FIGS. 10(D) and (F) are through-hole conductors 36 of the first embodiment. When a core substrate is warped, it is thought that stresses tend to concentrate in bent portions. If the reference example and the first embodiment are compared in cross-sectional views, the number of bent portions of a through-hole conductor in the reference example is two, whereas the number of bent portions of a through-hole conductor of the first embodiment is six. A through-hole conductor of the first embodiment contains more bent portions than a through-hole conductor of the reference example. Therefore, when the first embodiment and the reference example are compared, it is thought that stresses on a through-hole conductor are dispersed to more portions in the first embodiment than in the reference example. Accordingly, it is thought that a through-hole conductor of the first embodiment has higher reliability than a through-hole conductor of the reference example. When FIGS. 10(D) and 10(F) are compared, strengths in resin insulation layers and an insulative substrate may be modified in FIG. 10(D). When comparing the degree at which a through-hole conductor bends at the boundary between a (first-1) opening portion and a (first-2) opening portion, and the degree at which a through-hole conductor bends at the junction of a first opening portion and a second opening portion, the latter is greater. The through-hole conductor tends to be damaged at the junction of the first opening portion and the second opening portion. However, since deformation of an insulative substrate is reduced by setting the strength of the insulative substrate higher than the strength of resin insulation layers, stresses that concentrate in the junction of the first opening portion and the second opening portion decrease. From such a point of view, it is preferred that a core substrate be made of an insulative substrate and of a first resin insulation layer and a second resin insulation layer sandwiching the insulative substrate, and that the strength of the insulative substrate be set greater than the strength of the first and second resin insulation layers. Accordingly, a through-hole conductor of the first embodiment is thought to have higher tolerance against stresses generated in a warped core substrate or the like than that of the reference example.

If a core substrate is made up of an insulative substrate and of a first resin insulation layer and a second resin insulation layer sandwiching the insulative substrate, an ingredient that dissolves in a chemical may be contained in first resin insulation layer (32A) and second resin insulation layer (32B). By dissolving the soluble ingredient on the surfaces of resin insulation layers using a chemical, the surfaces of resin insulation layers may be roughened. By forming roughened surfaces ($32\alpha$) on the surfaces of core substrate 30, first and second circuits may be formed on the first and second surfaces of core substrate 30 using an additive method. Since circuits may be formed on the core substrate using an additive method and not using a subtractive method, the width of circuits or the distance between circuits may be set smaller on the core substrate. Accordingly, the number of built-up layers on the core substrate is reduced.

In the following, a method for manufacturing multilayer printed wiring board 10 is described with reference to FIGS. 1-5.

(1) Insulative substrate 31 made of reinforcing material and resin is prepared (FIG. 1(A)). The thickness of insulative substrate 31 is set at 0.2-0.8 mm. Glass cloth, aramid fiber and glass fiber may be listed as a reinforcing material. Glass cloth is preferred as a reinforcing material from a viewpoint of strength. Epoxy resin and BT (bismaleimide triazine) resin may be listed as a resin. Hydroxide particles may be dispersed in a resin. As for hydroxides, metal hydroxides such as $Al(OH)3$, $Mg(OH)2$, $Ca(OH)2$, $Ba(OH)2$ and the like are preferred. The thermal expansion coefficient may be set smaller in the insulative substrate. When forming a (first-2) opening portion and a (second-2) opening portion in the insulative substrate using a laser, values in ($\Delta W2$) and ($\Delta W4$) may be set greater. Hydroxides are disintegrated by heat, producing water. Thus, it is thought that hydroxides may rob heat from the material that forms an insulative substrate. Namely, if an insulative substrate contains a hydroxide, it is thought that the insulative substrate is hard to process by a laser. Forming a first opening portion made up of a (first-1) opening portion and a (first-2) opening portion as well as forming a second opening portion made up of a (second-1) opening portion and a (second-2) opening portion become easier. When forming opening portions using a $CO_2$ laser, the insulative substrate is preferred to contain a hydroxide.

On main surface (31A) and secondary surface (31B) of insulative substrate 31, resin film for resin insulation layers 32 (brand name: ABF-45SH, made by Ajinomoto) is laminated. A core substrate made of an insulative substrate and resin insulation layers is obtained through thermal pressing (FIG. 1(B)). The core substrate has first surface (30A) and second surface (30B) opposite the first surface. A resin insulation layer formed on the main surface of insulative substrate 31 is first resin insulation layer (32A). The first resin insulation layer has a front surface and a back surface opposite the front surface. The back surface faces the main surface. A resin insulation layer formed under the secondary surface of insulative substrate 31 is second resin insulation layer (32B). The second resin insulation layer has an upper surface and a lower surface opposite the upper surface. The secondary surface faces the upper surface. Resin film for resin insulation layers contains an ingredient which dissolves in a chemical agent and inorganic particles for adjusting thermal expansion coefficients. The material for the first resin insulation layer and the second resin insulation layer may be the same as the material for the insulative substrate. However, the first and second resin insulation layers are preferred not to contain a reinforcing material, and the insulative substrate is preferred to contain a reinforcing material. The values of ($\Delta W1$) and ($\Delta W2$) may be modified easily. The values of ($\Delta W3$) and ($\Delta W4$) may be modified easily. The values of ($\Delta H1$) and ($\Delta H2$) may be modified easily. The values of ($\Delta H3$) and ($\Delta H4$) may be modified easily.

(2) Using a $CO_2$ gas laser, by irradiating a laser from first surface (30A) of core substrate 30, first opening portion (33A) is formed in the first-surface side of the core substrate (FIG. 1(C)).

(3) Using a $CO_2$ gas laser, by irradiating a laser from second surface (30B) of core substrate 30, second opening portion (33B) is formed in the second-surface side of the core substrate. Penetrating hole 33 is formed by the first opening portion and the second opening portion, which are joined in insulative substrate 31 (FIG. 1(D)).

Figure 14:
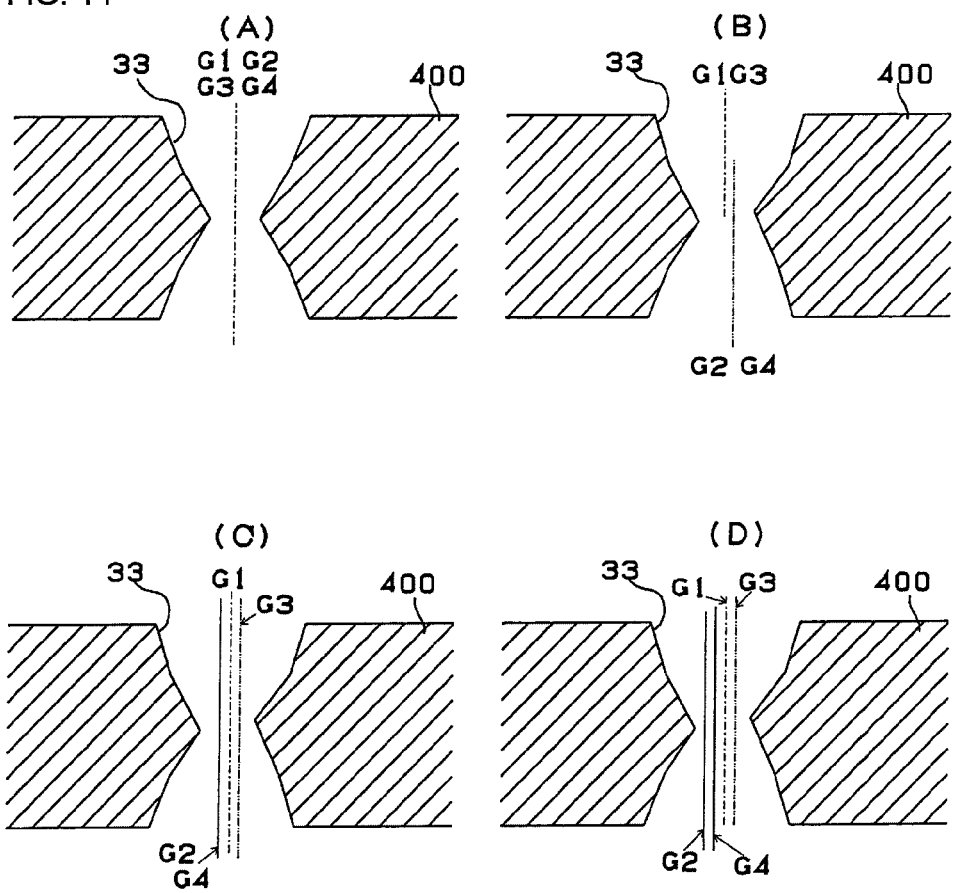
FIG. 14 are cross-sectional views showing penetrating holes in the first embodiment.

FIGS. 11 and 14 show magnified views of penetrating hole 33 in FIG. 1(D). In FIG. 11, a core substrate is made of resin insulation layers and an insulative substrate. The resin insulation layers and insulative substrate may be formed with the same material or different materials. Different materials are preferred. In FIG. 14, a core substrate is made of either one insulative substrate or one resin insulation layer. FIG. 11(A)

and FIG. 14(A) show examples where the first, second, third and fourth gravity lines overlap each other. FIG. 11(B) and FIG. 14(B) show examples where the first and third gravity lines overlap each other and the second and fourth gravity lines overlap each other, but the first gravity line and the second gravity line are offset from each other. FIG. 11(C) and FIG. 14(C) show examples where the second and fourth gravity lines overlap each other, but the first, second and third gravity lines are offset from each other. FIG. 11(D) and FIG. 14(D) show examples where the first, second, third and fourth gravity lines are offset from each other. The first opening portion becomes thinner from the first surface of the core substrate toward the second surface. In FIG. 11, the inner walls of the first opening portion bend toward the inside of the first opening portion at the interface of the insulative substrate and the first resin insulation layer. The second opening portion becomes thinner from the second surface of the core substrate toward the first surface. The inner walls of the second opening portions bend toward the inside of the opening portion at the interface of the insulative substrate and the second resin insulation layer. The degree at which the diameter of first opening portion (33A) decreases is set greater in insulative substrate 31 than in the first resin insulation layer. In the same manner, the degree at which the diameter of second opening portion (33B) decreases is set greater in insulative substrate 31 than in the second resin insulation layer.

The first opening portion becomes thinner from the first surface of the core substrate toward the second surface. In FIG. 14, the inner walls of the first opening portion bend toward the inside of the first opening portion at the boundary between the (first-1) opening portion and the (first-2) opening portion. The second opening portion becomes thinner from the second surface of the core substrate toward the first surface. The inner walls of the second opening portion bend toward the inside of the second opening portion at the boundary between the (second-1) opening portion and the (second-2) opening portion. The degree at which the diameter of first opening portion (33A) decreases is set greater in the (first-2) opening portion than in the (first-1) opening portion. In the same manner, the degree at which the diameter of second opening portion (33B) decreases is set greater in the (second-2) opening portion than in the (second-1) opening portion.

In the following, a method for forming penetrating holes shown in FIGS. 11 and 14 is shown.

Penetrating holes shown in FIGS. 11 and 14 may be formed by a processing method as follows. If a first opening portion and a second opening portion are formed by laser irradiations having multiple pulses, the laser intensity is set lower after a predetermined number of pulses. For example, if a first opening portion and a second opening portion are formed by two-pulse laser irradiations, the laser intensity of the second pulse is set lower than the laser intensity of the first pulse. Openings to be formed by the first pulse are a (first-1) opening portion and a (second-1) opening portion; openings to be formed by the second pulse are a (first-2) opening portion and a (second-2) opening portion. In doing so, openings to be formed by the first pulse may be formed differently from openings to be formed by the second pulse. Since the second pulse has weaker energy than the first pulse, the first opening portion bends inward at the boundary between the (first-1) opening portion and the (first-2) opening portion. In the same manner, the second opening portion bends inward at the boundary between the (second-1) opening portion and the (second-2) opening portion. Positions of gravity lines are modified by adjusting positions to be irradiated by a laser. More detailed descriptions will be provided in the following.

Other examples are shown in the following. If a core substrate is made of an insulative substrate which is hard to process by a laser and of resin insulation layers sandwiching the insulative substrate which are easy to process by a laser, penetrating holes shown in FIG. 11 may be formed. In such examples, when processing resin insulation layers and an insulative substrate using the same laser intensity, the amount to be processed is different in the resin insulation layers and the insulative substrate. The amount to be processed is greater in resin insulation layers than in the insulative substrate. In doing so, openings formed in resin insulation layers may be formed differently from openings formed in the insulative substrate. Openings formed in resin insulation layers are a (first-1) opening portion and a (second-1) opening portion, and openings formed in the insulative substrate are a (first-2) opening portion and a (second-2) opening portion. Since the insulative substrate is harder to process by a laser than the resin insulation layers are, the first opening portion bends inward at the boundary between the (first-1) opening portion and the (first-2) opening portion. In the same manner, the second opening portion bends inward at the boundary between the (second-1) opening portion and the (second-2) opening portion. In such situations, boundaries are positioned most likely at interfaces of the resin insulation layers and the insulative substrate. However, positions for the first opening portion and the second opening portion to bend may be in the insulative substrate, because the same effects as above are achieved. Combination examples of an insulative substrate and resin insulation layers will be listed in the following. An insulative substrate is made of reinforcing material and resin, and resin insulation layers are made of inorganic particles and resin. Since the insulative substrate contains reinforcing material, the insulative substrate is harder to process by a laser than resin insulation layers are. Positions where the first opening portion and the second opening portion bend are preferred to be between an interface of a resin insulation layer and the insulative substrate and a reinforcing material in the insulative substrate, including an example where opening portions bend in the reinforcing material (see FIG. 12(C)). Another example may be such that resin insulation layers contain oxide particles and an insulative substrate contains hydroxide particles. Since the insulative substrate contains hydroxide particles, the insulative substrate is harder to process by a laser than resin insulation layers are. As for oxide particles, alumina, silica, barium oxide or the like may be listed.

The insulative substrate is made of resin and reinforcing material, and resin insulation layers are made of inorganic particles and resin without reinforcing material. In such an example, penetrating holes shown in FIG. 11 are obtained as well. Moreover, it is preferred that the insulative substrate contain hydroxide particles and that the resin insulation layers not contain hydroxide particles.

Penetrating holes shown in FIG. 11(A) and FIG. 14(A) may be formed by the following method (method example 1). A first-pulse laser is irradiated in a predetermined spot on the first surface of a core substrate. Such a position is set as spot (M). A second-pulse laser is irradiated on the same spot. The first laser pulse has greater energy than the second laser pulse. Accordingly, a first opening portion is formed with a (first-1) opening portion and a (first-2) opening portion. Next, a first-pulse laser is irradiated on the second surface of the core substrate. The laser position for a first pulse (spot (N)) is located opposite spot (M). Namely, the laser position for a first pulse (spot (N)) is a point where a straight line passing through spot (M) and perpendicular to the first surface of the core substrate intersects the second surface of the core substrate. A second-pulse laser is irradiated at the same spot. The first laser pulse has greater energy than the second laser pulse. The penetrating holes shown in FIG. 11(A) and FIG. 14(A) are formed by joining the first opening portion and the second opening portion. Core substrates which can employ the above method are: core substrate 400 made of resin and inorganic particles; core substrate 400 made of resin and reinforcing material; core substrate 400 made of inorganic particles, resin and reinforcing material; core substrate 400 made of hydroxide particles, resin and reinforcing material; and core substrate 30 made of an insulative substrate and resin insulation layers sandwiching the insulative substrate. If openings are formed under the same conditions by a laser in an insulative substrate and resin insulation layers, forming openings in resin insulation layers is easier than forming openings in the insulative substrate.

A penetrating hole shown in FIG. 11(B) may be formed as follows (method example 2). A core substrate shown in FIG. 11(B) is formed with an insulative substrate which is made of reinforcing material, metal hydroxide and resin, and with resin insulation layers sandwiching the insulative substrate which are made of inorganic particles and resin. A laser is irradiated at a predetermined position (spot (O)) on the first surface of the core substrate to form first opening portion (33A) made up of a (first-1) opening portion and a (first-2) opening portion (FIG. 15(A)). Next, a laser is irradiated at a predetermined position (spot (P)) on the second surface of the core substrate to form second opening portion (33B) made up of a (second-1) opening portion and a (second-2) opening portion (FIG. 15(B)). Spot (O) and spot (P) do not face each other. Namely, spot (P) is located at a predetermined distance from the point where a straight line passing through spot (O) and perpendicular to the first surface of the core substrate intersects the second surface of the core substrate. Accordingly, a penetrating hole shown in FIG. 11(B) is formed by the first opening portion and the second opening portion joined in the insulative substrate.

Penetrating holes shown in FIG. 11(C) and FIG. 14(C) may be formed by modifying method example 1 (method example 3). By shifting the laser position for a first pulse and the laser position for a second pulse (spot (Q)) to be irradiated on the first surface of a core substrate in method example 1, penetrating holes shown in FIG. 11(C) and FIG. 14(C) are formed. A penetrating hole shown in FIG. 11(C) is obtained by joining a first opening portion and a second opening portion. At that time, the diameter of the second-pulse laser is preferred to be set smaller than the diameter of the first-pulse laser.

A penetrating hole in FIG. 11(C) may be formed by modifying method example 2 (method example 4). The number of laser pulses to be irradiated on the first surface of a core substrate in method example 2 is multiple, the same as in method example 1. By shifting the laser position for a first pulse (spot (O)) and the laser position for a second pulse (spot (S)) on the first surface of the core substrate (FIG. 15(C)), the penetrating hole shown in FIG. 11(C) is obtained. The penetrating hole shown in FIG. 11(C) is obtained by joining a first opening portion and a second opening portion in the insulative substrate. At that time, the diameter of the second-pulse laser is preferred to be set smaller than the diameter of the first-pulse laser.

The penetrating holes in FIG. 11(D) and FIG. 14(D) may be formed by modifying method example 3 (method example 5). In method example 5, the laser position for a second pulse (spot (R)) to be irradiated on the second surface of a core substrate is located at a predetermined distance from the laser position for a first pulse. The penetrating holes shown in FIG. 11(D) and FIG. 14(D) are obtained by joining a first opening portion and a second opening portion. At that time, the diameter of the second-pulse laser is preferred to be set smaller than the diameter of the first-pulse laser. The following does not overlap each other: a straight line (straight line M) passing through spot (M) and perpendicular to the first surface of the core substrate; a straight line (straight line N) passing through spot (N) and perpendicular to the first surface of the core substrate; a straight line (straight line Q) passing through spot (Q) and perpendicular to the first surface of the core substrate; and a straight line (straight line R) passing through spot (R) and perpendicular to the first surface of the core substrate (FIG. 15(D)).

A penetrating hole in FIG. 11(D) may be formed by modifying method example 4 (method example 6). In method example 6, the number of laser pulses to be irradiated on the second surface of a core substrate is multiple. The laser position (spot (R)) for a second pulse to be irradiated on the second surface of the core substrate is located at a predetermined distance from the laser position for a first pulse. At that time, the diameter of the second pulse is preferred to be set smaller than the diameter of the first pulse. The penetrating hole in FIG. 11(D) is obtained by joining the first opening portion and the second opening portion. The following does not overlap each other: a straight line (straight line O) passing through spot (O) and perpendicular to the first surface of the core substrate; a straight line (straight line P) passing through spot (P) and perpendicular to the first surface of the core substrate; a straight line (straight line S) passing through spot (S) and perpendicular to the first surface of the core substrate; and a straight line (straight line R) passing through spot (R) and perpendicular to the first surface of the core substrate.

Figure 12:
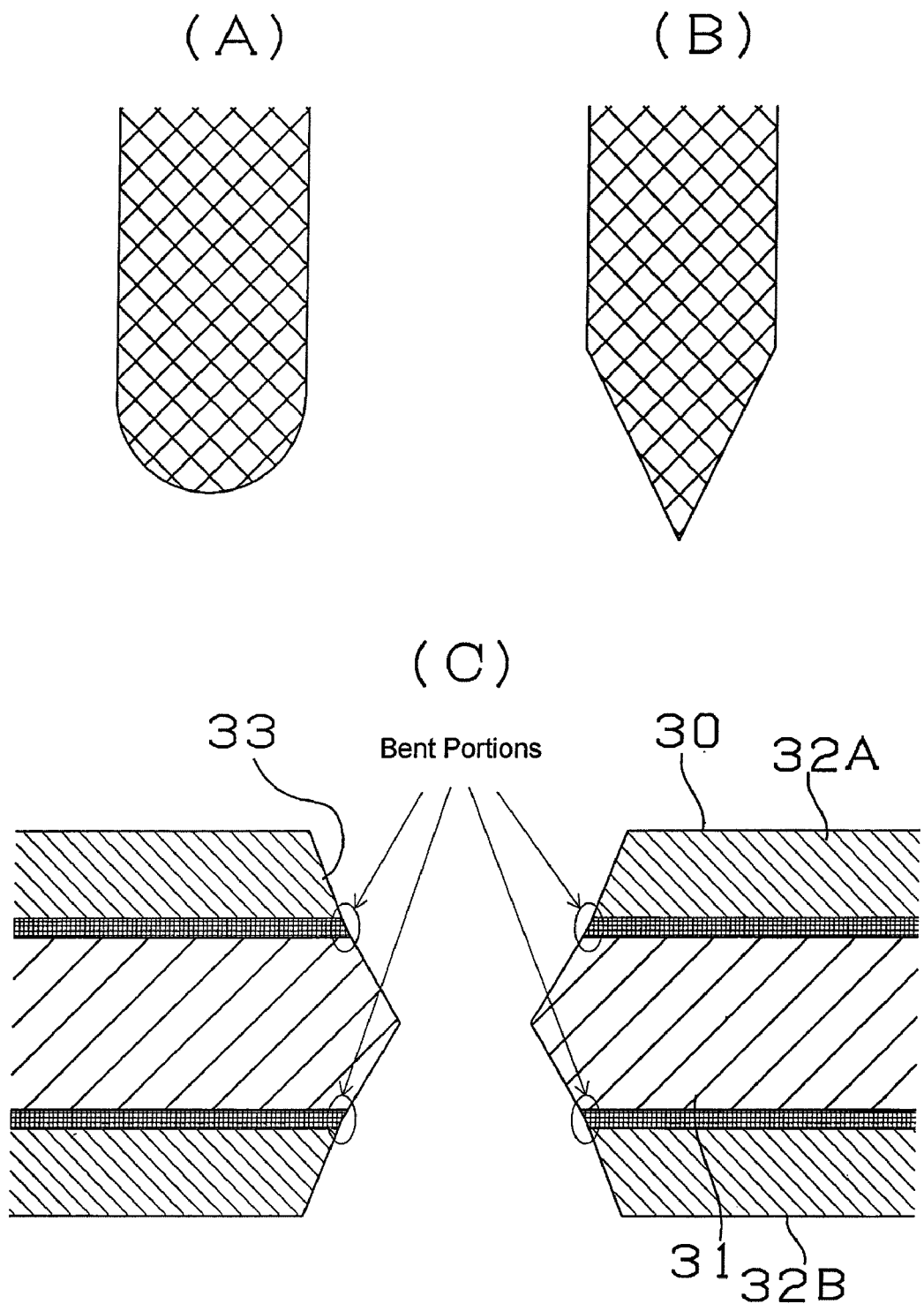
FIGS. 12(A) and 12(B) are views schematically showing energy intensity of a laser.
FIG. 12(C) is a view showing an example where a penetrating hole is bent in a reinforcing material.

In any of the method examples, it is preferable to irradiate a laser having energy intensities shown in FIGS. 12(A) and (B). The lengths in the drawing schematically indicate laser intensity. The intensity is greater in the center than on the periphery. Laser intensity decreases from the center toward the periphery either exponentially or in a straight line.

When the laser irradiation position to form a (first-1) opening portion and the laser irradiation position to form a (first-2) opening portion are located at a predetermined distance from each other for offsetting the first gravity line and the third gravity line, the laser diameter for forming the (first-1) opening portion is preferred to be set greater than the laser diameter for forming the (first-2) opening portion.

When the laser irradiation position to form a (second-1) opening portion and the laser irradiation position to form a (second-2) opening portion are located at a predetermined distance from each other for offsetting the second gravity line and the fourth gravity line, the laser diameter for forming the (second-1) opening portion is preferred to be set greater than the laser diameter for forming the (second-2) opening portion.

(4) Core substrate 30 with penetrating hole 33 is immersed for 10 minutes in an 80° C. solution containing 60 g/L permanganic acid. Roughened surfaces (32α) are formed on the surfaces of resin insulation layers 32 (FIG. 1(E)). The first surface and the second surface of the core substrate are roughened.

(5) Palladium catalyst (made by Atotech) is attached to the surfaces of core substrate 30. After that, the core substrate is immersed in an electroless plating solution. Electroless plated film 23 is formed on the first and second surfaces of the core substrate and on the inner walls of the penetrating hole (see FIG. 2(A)). As for such electroless plated film, electroless copper-plated film and electroless nickel-plated film may be listed. The thickness is 0.2 μm-0.6 μm. Plating resist 25 is formed on electroless plated film 23 (FIG. 2(B)). Using electroless plated film as a seed layer, electrolytic plated film is formed on the electroless plated film left exposed by the plating resist. Penetrating hole 33 is filled with electrolytic plated film 24 (FIG. 2(C)). Instead of electroless plated film, sputtered film may be formed on the inner walls of penetrating hole 33 and on the surfaces of the core substrate.

(6) Plating resist is removed. The electroless plated film exposed by removing the plating resists is etched away. First circuit (34A) is formed on the first surface of the core substrate. Second circuit (34B) is formed on the second surface of the core substrate (see FIG. 3(A)). Printed wiring board 1000 is completed. The first circuit has first conductive circuit (34AC) and first through-hole land (first land) (34AL). The first conductive circuit is a circuit that is formed on the first surface of the core substrate, and first through-hole land (34AL) is formed with a circuit covering a through-hole conductor and a circuit formed on the first surface of the core substrate surrounding the through-hole conductor. The second circuit has second conductive circuit (34BC) and second through-hole land (second land) (34BL). Second conductive circuit (34BC) is a circuit that is formed on the second surface of the core substrate, and second through-hole land (34BL) is formed with a circuit covering a through-hole conductor and a circuit formed on the second surface of the core substrate surrounding the through-hole conductor.

Figure 13:
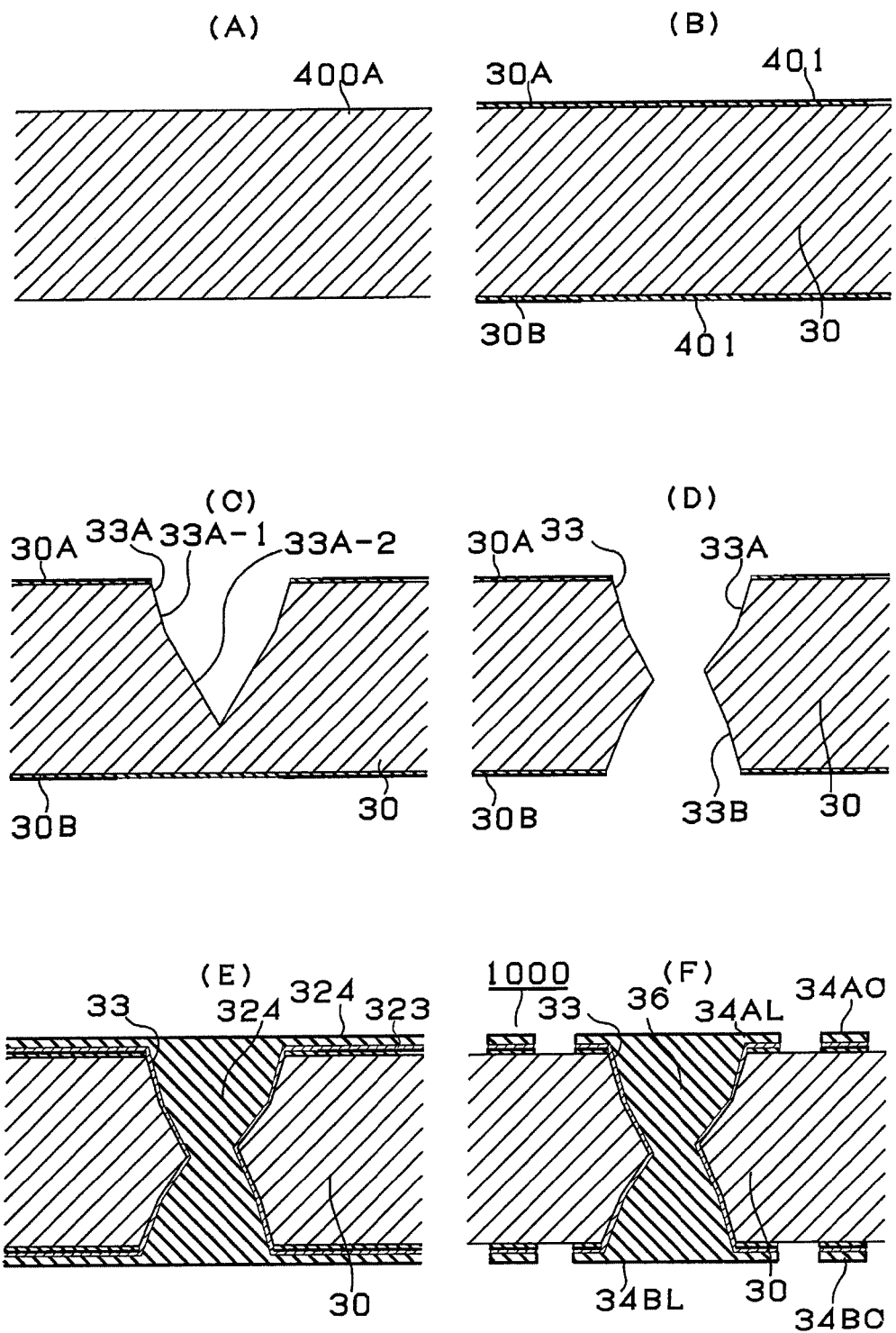
FIG. 13 are views showing other steps for manufacturing a printed wiring board of the first embodiment.

In the above example, a core substrate is formed with resin insulation layers and an insulative substrate. However, the core substrate may be formed only with an insulative substrate or a resin insulation layer. The manufacturing method is simplified. Instead of the above method (FIGS. 1 through 3(A)), another method for manufacturing a printed wiring board is shown in FIG. 13. In that example, one insulative substrate or one resin insulation layer is a starting material (FIG. 13(A)). Copper foils 401 are laminated on single insulative substrate (400A) or single resin insulation layer (400A) (FIG. 13(B)). A laser is irradiated on first surface (30A) of the single insulative substrate or the single resin insulation layer. First opening portion (33A) is formed in the first-surface side of the single insulative substrate or the single resin insulation layer (FIG. 13(C)). A laser is irradiated on second surface (30B) of the single insulative substrate or the single resin insulation layer. Second opening portion (33B) is formed in the second-surface side of the single insulative substrate or the single resin insulation layer. Penetrating hole 33 is formed by first opening portion (33A) and second opening portion (33B), which are joined in the single insulative substrate or the single resin insulation layer (FIG. 13(D)). A core substrate with a penetrating hole is completed. The penetrating hole may be formed by any of the above methods. Seed layer 323 is formed on the surfaces of the core substrate and on the inner walls of the penetrating hole by electroless plating or the like. Electrolytic plated film 324 is formed on seed layer 323. Penetrating hole 33 is filled with electrolytic plated film 324 (FIG. 13(E)). By forming conductive circuits (34AC, 34BC) and lands (34AL, 34BL) on the core substrate by etching, printed wiring board 1000 is completed (FIG. 13(F)).

(9) Next, roughened layers (340) are formed on the surfaces of first and second circuits (34A, 34B) (FIG. 3(B)).

(10) On both surfaces of core substrate 30 having circuits, resin film for interlayer resin insulation layers (brand name: ABF-45SH, made by Ajinomoto) is laminated. By curing the film, interlayer resin insulation layers (50A, 50B) are formed on both surfaces of the core substrate (FIG. 3(C)).

(11) Via-conductor openings 51 reaching conductive circuits or through-hole lands are formed in interlayer resin insulation layers (50A, 50B) using a $CO_2$ gas laser (FIG. 3(D)).

(12) The substrate with via-conductor openings 51 is immersed for 10 minutes in an 80° C. solution containing 60 g/L permanganic acid. Roughened surfaces (50α) are formed on the surfaces of interlayer resin insulation layers (50A, 50B) including the inner walls of via-conductor openings 51 (FIG. 4(A)). By immersing the substrate in a catalyst solution, catalyst nuclei are attached on the surfaces of interlayer resin insulation layers and on the inner-wall surfaces of via-conductor openings.

(13) Next, by immersing the substrate in an electroless copper plating solution (Thru-Cup PEA) made by C. Uyemura Co., Ltd., electroless copper-plated film 52 is formed on the surfaces of interlayer resin insulation layers (50A, 50B) including the inner walls of via-conductor openings 51 (FIG. 4(B)).

(14) Plating resist 54 is formed on electroless copper-plated film 52. Electrolytic copper-plated film 56 is formed on the electroless plated film left exposed by plating resist 54 (FIG. 4(C)).

(15) Plating resist 54 is removed. By removing the electroless plated film between portions of electrolytic copper-plated film through etching, independent conductive circuits (58A, 58B) and via conductors (60A, 60B) are formed (FIG. 4(D)). Multilayer wiring board 300 is obtained.

(16) Roughened layers (58α) are formed on the surfaces of conductive circuits (58A, 58B) and via conductors (60A, 60B) (FIG. 5(A)).

(18) Next, solder-resist layers (70A, 70B) with openings (71A, 71B) are formed on both surfaces of multilayer wiring board 300 (FIG. 5(B)). Top surfaces of conductive circuits (58A, 58B) and via conductors (60A, 60B) are exposed through openings (71A, 71B). Top surfaces of conductive circuits (58A, 58B) and via conductors (60A, 60B) exposed through openings (71A, 71B) function as solder pads (72A, 72B).

(19) A nickel-plated layer is formed on solder pads, and a gold-plated layer is formed on the nickel-plated layer (FIG. 5(C)). Instead of nickel-gold layers, nickel-palladium-gold layers may also be formed on solder pads.

(21) After that, solder balls are loaded on opening portions (71A, 71B) in the solder-resist layers, and reflowed at 230° C. Accordingly, solder bumps (78A, 78B) are formed on solder pads (FIG. 6).

First Example (1) Insulative substrate 31 made of glass cloth, epoxy resin and magnesium hydroxide is prepared (FIG. 1(A)). The thickness of insulative substrate 31 is 0.2 mm. Insulative substrate 31 has main surface (31A) and secondary surface (31B) opposite the main surface. Resin film for resin insulation layers 32 (brand name: ABF-45SH, made by Ajinomoto) is laminated on both surfaces of the insulative substrate. By thermal pressing the film, a core substrate formed with an insulative substrate and resin insulation layers is obtained (FIG. 1(B)). Resin insulation layers contain ingredients that dissolve in a KMnO4 solution and silica for adjusting thermal expansion coefficients. The first resin insulation layer and the second resin insulation layer do not contain reinforcing material.

(2) A $CO_2$ gas laser is irradiated at a predetermined position (spot 1) on first surface (30A) of core substrate 30. The number of laser pulses to be irradiated is four. First opening portion (33A) made up of a (first-1) opening portion and a (first-2) opening portion is formed in the first-surface side of the core substrate (FIG. 1(C)). The (first-1) opening portion is an opening portion formed in the first resin insulation layer, and the (first-2) opening portion is an opening portion formed in the insulative substrate. Since first resin insulation layer (32A) tends to be processed by a laser more easily than insulative substrate 31, the first opening portion bends inward at the boundary between the (first-1) opening portion and the (first-2) opening portion. The bent positions are located substantially at the interface of first resin insulation layer (32A) and insulative substrate 31.

(3) A $CO_2$ gas laser is irradiated at a predetermined position (spot 2) on second surface (30B) of core substrate 30. Spot 2 is where a straight line passing through spot 1 and perpendicular to the first surface of the core substrate intersects the second surface of the core substrate. The first gravity line overlaps the second gravity line. The number of laser pulses is four. Second opening portion (33B) made up of a (second-1) opening portion and a (second-2) opening portion is formed in the second-surface side of the core substrate (FIG. 1(D)). A penetrating hole is formed by joining the first opening portion and the second opening portion. The (second-1) opening portion is an opening portion formed in the second resin insulation layer and the (second-2) opening portion is an opening portion formed in the insulative substrate. Since second resin insulation layer (32B) tends to be processed by a laser more easily than insulative substrate 31, the second opening portion bends inward at the boundary between the (second-1) opening portion and the (second-2) opening portion. The bent positions are located substantially at the interface of second resin insulation layer (32B) and insulative substrate 31. A penetrating hole shown in FIG. 11(A) is formed.

(4) Core substrate 30 with penetrating hole 33 is immersed for 10 minutes in an 80° C. solution containing 60 g/L permanganic acid. Roughened surfaces (32α) are formed on the surfaces of resin insulation layers 32 (FIG. 1(E)). The first surface and the second surface of the core substrate are roughened.

(5) A palladium catalyst (made by Atotech) is attached to the surfaces of core substrate 30. Then, the core substrate is immersed in an electroless copper-plating solution (made by C. Uyemura Co., Ltd.). Electroless copper-plated film 23 is formed on the first and second surfaces of the core substrate and on the inner walls of the penetrating hole (see FIG. 2(A)). The thickness of the electroless copper-plated film is 0.4 μm. Plating resist 25 is formed on electroless plated film 23 (FIG. 2(B)). Electrolytic copper-plated film 24 is formed on the electroless plated film left exposed by plating resist 25 using electroless plated film 23 as a seed layer. Penetrating hole 33 is filled with electrolytic copper-plated film 24 (FIG. 2(C)).

(6) The plating resist is removed. Electroless copper-plated film exposed by removing the etching resist is etched away. First conductive circuit (34AC) and first through-hole land (34AL) are formed on the first surface of the core substrate, and second conductive circuit (34BC) and second through-hole land (34BL) are formed on the second surface of the core substrate. Simultaneously, through-hole conductor 36 is formed, connecting the first and second conductive circuits (see FIG. 3(A)). The thickness of electrolytic copper-plated film is substantially 15 μm. Printed wiring board 1000 of the first example is completed.

Second Example (1) Prepreg 400 made of glass cloth and epoxy resin is prepared (FIG. 13(A)). On both surfaces of the prepreg, 12 μm-thick copper foil 401 is laminated. By thermal pressing, the prepreg is cured, and core substrate 30 having copper foil is obtained (FIG. 13(B)).

(2) A $CO_2$ gas laser is irradiated at a predetermined position (spot 10) on first surface (30A) of core substrate 30. The number of laser pulses to be irradiated is four. The laser intensity for the first pulse is set equal to that for the second pulse, and the laser intensity for the third pulse is set equal to that for the fourth pulse. The laser intensity for the first pulse is set higher than the laser intensity for the third pulse. The irradiation position (spot 10) is the same for all pulses. First opening portion (33A) made up of (first-1) opening portion (33A-1) and (first-2) opening portion (33A-2) is formed in the first-surface side of the core substrate (FIG. 13(C)). Since the laser intensity is set lower on and after the third pulse, first opening portion (33A) bends inward at the boundary between (first-1) opening portion (33A-1) and (first-2) opening portion (33A-2).

A $CO_2$ gas laser is irradiated at a predetermined position (spot 11) on second surface (30B) of core substrate 30. The number of laser pulses to be irradiated is four. The laser intensity for the first pulse is set equal to that for the second pulse, and the laser intensity for the third pulse is set equal to that for the fourth pulse. The laser intensity for the first pulse is set greater than the laser intensity for the third pulse. The irradiation position (spot 11) is the same for all pulses. Second opening portion (33B) made up of (second-1) opening portion (33B-1) and (second-2) opening portion (33B-2) is formed in the second-surface side of the core substrate. Penetrating hole 33 made up of the first opening portion and the second opening portion is formed (FIG. 13(D)). The point where a straight line passing through spot 10 and perpendicular to the first surface of the core substrate intersects the second surface of the core substrate is located at a predetermined distance from spot 11. Since the laser intensity is set lower on and after the third pulse, the second opening portion bends inward at the boundary between the (second-1) opening portion and the (second-2) opening portion. Penetrating hole 33 is formed as shown in FIG. 14(B).

Copper film 323 is formed by sputtering on the first and second surfaces of the core substrate and on the inner walls of the penetrating hole. Using copper film 323 as a seed layer, electrolytic copper-plated film 324 is formed on the first and second surfaces of the core substrate. Simultaneously, penetrating hole 33 is filled with electrolytic copper-plated film 324 (FIG. 13(E)). Etching resist is formed on the electrolytic copper-plated film. The electrolytic copper-plated film, copper film and copper foil left exposed by the etching resist are etched away.

First conductive circuit (34AC) and first through-hole land (34AL) are formed on the first surface of the core substrate, and second conductive circuit (34BC) and second through-hole land (34BL) are formed on the second surface of the core substrate. Simultaneously, through-hole conductor 36 is formed, connecting the first and second conductive circuits. The thickness of the electrolytic copper-plated film is substantially 15 μm. Printed wiring board 1000 of the second example is completed (FIG. 13(F)).

Third Example

The method for manufacturing a printed wiring board according to the third example is a modified example of the first example.

The method for forming a core substrate of the third example is the same as in the first example. First and second laser pulses are irradiated at a predetermined position (spot 10) on the first surface of the core substrate. Then, third and fourth laser pulses are irradiated at a position (spot 100) which is located at a predetermined distance from spot 10. The laser intensity for the first pulse is set equal to that for the second pulse, and the laser intensity for the third pulse is set equal to that for the fourth pulse. The laser intensity for the first pulse is set greater than the laser intensity for the third pulse. The diameter of the first laser pulse is equal to that of the second laser pulse, and the diameter of the third laser pulse is equal to that of the fourth laser pulse. The diameter of the first laser pulse is set greater than that of the third laser pulse.

First through fourth laser pulses are irradiated at a predetermined position (spot 20) on the second surface of the core substrate. A point (point of intersection 1) where a straight line passing through spot 10 and perpendicular to the first surface of the core substrate intersects the second surface of the core substrate is located at a predetermined distance from spot 20. In addition, point (point of intersection 2) where a straight line passing through spot 100 and perpendicular to the first surface of the core substrate intersects the second surface of the core substrate is located at a predetermined distance from spot 20. Point of intersection 1, point of intersection 2 and spot 20 do not overlap. The laser intensity for the first pulse is set equal to that for the second pulse, and the laser intensity for the third pulse is set equal to that for the fourth pulse. The laser intensity for the first pulse is set greater than that for the third laser pulse. A penetrating hole shown in FIG. 11(C) is formed.

Fourth Example

The method for manufacturing a printed wiring board according to the fourth example is a modified example of the third example.

The method for forming a core substrate of the fourth example is the same as in the first example. First and second laser pulses are irradiated at a predetermined position (spot 10) on the first surface of the core substrate. Then, third and fourth laser pulses are irradiated at a position (spot 100) which is located at a predetermined distance from spot 10. The laser intensity for the first pulse is set equal to that for the second pulse, and the laser intensity for the third pulse is set equal to that for the fourth pulse. The laser intensity for the first pulse is set greater than the laser intensity for the third pulse. The diameter of the first laser pulse is equal to that of the second laser pulse, and the diameter of the third laser pulse is equal to that of the fourth laser pulse. The diameter of the first laser pulse is greater than that of the third laser pulse.

First and second laser pulses are irradiated at a predetermined position (spot 20) on the second surface of the core substrate. Then, third and fourth laser pulses are irradiated at a position (spot 200) which is located at a predetermined distance from spot 20. A point (point of intersection 1) where a straight line passing through spot 10 and perpendicular to the first surface of the core substrate intersects the second surface of the core substrate is located at predetermined distances from spot 20 and spot 200. In addition, point (point of intersection 2) where a straight line passing through spot 100 and perpendicular to the first surface of the core substrate intersects the second surface of the core substrate is located at predetermined distances from spot 20 and spot 200. Point of intersection 1, point of intersection 2, spot 20 and spot 200 do not overlap. The laser intensity for the first pulse is set equal to that for the second pulse, and the laser intensity for the third pulse is set equal to that for the fourth pulse. The laser intensity for the first pulse is set greater than that for the third pulse. The diameter of the first laser pulse is set greater than that of the third laser pulse. A penetrating hole shown in FIG. 11(D) is formed.

Example of Built-Up Wiring Board

Printed wiring board 1000 according to any one of the first through the fourth examples may be used as a core substrate in a built-up wiring board.

On both surfaces of a printed wiring board according to any one of the first through fourth examples, resin film for interlayer resin insulation layers (brand name: ABF-45SH, made by Ajinomoto) is laminated. By curing the film, interlayer resin insulation layers (50A, 50B) are formed on both surfaces of a core substrate (FIG. 3(C)).

(11) Using a $CO_2$ gas laser, via-conductor openings 51 are formed in interlayer resin insulation layers (50A, 50B), reaching conductive circuits or through-hole lands (FIG. 3(D)).

(12) The substrate with via-conductor openings 51 is immersed for 10 minutes in an 80° C. solution containing 60 g/L permanganic acid. Roughened surfaces (50α) are formed on the surfaces of interlayer resin insulation layers (50A, 50B) including inner walls of via-conductor openings 51 (FIG. 4(A)). By immersing the substrate in a catalyst solution, catalyst nuclei are attached to the surfaces of the interlayer resin insulation layers and to inner-wall surfaces of the via-conductor openings.

(13) Next, by immersing the substrate in an electroless copper plating solution (Thru-Cup PEA) made by C. Uyemura Co., Ltd., electroless copper-plated film 52 is formed on the surfaces of interlayer resin insulation layers (50A, 50B) including the inner walls of via-conductor openings 51 (FIG. 4(B)).

(14) Plating resist 54 is formed on electroless copper-plated film 52. Electrolytic copper-plated film 56 is formed on the electroless plated film left exposed by plating resist 54 (FIG. 4(C)).

(15) Plating resist 54 is removed. By etching away the electroless plated film between portions of electrolytic copper-plated film, independent conductive circuits (58A, 58B) and via conductors (60A, 60B) are formed (FIG. 4(D)). Multilayer wiring board 300 is obtained.

(16) Next, roughened surfaces (58α) are formed on the surfaces of conductive circuits (58A, 58B) and via conductors (60A, 60B) (FIG. 5(A)).

(18) Next, solder-resist layers (70A, 70B) with openings (71A, 71B) are formed on both surfaces of the multilayer wiring board (FIG. 5(B)). Top surfaces of conductive circuits (58A, 58B) and via conductors (60A, 60B) are exposed through openings (71A, 71B). Top surfaces of conductive circuits (58A, 58B) and via conductors (60A, 60B) exposed through openings (71A) work as solder pads.

(19) A nickel-plated layer is formed on solder pads, and a gold-plated layer is formed on the nickel-plated layer (FIG. 5(C)).

(21) After that, solder balls are loaded on opening portions (71A, 71B) in the solder-resist layers, and reflowed at 230° C. Accordingly, solder bumps (78A, 78B) are formed on solder pads (FIG. 6). A built-up wiring board is completed.

Second Embodiment

Figure 16:
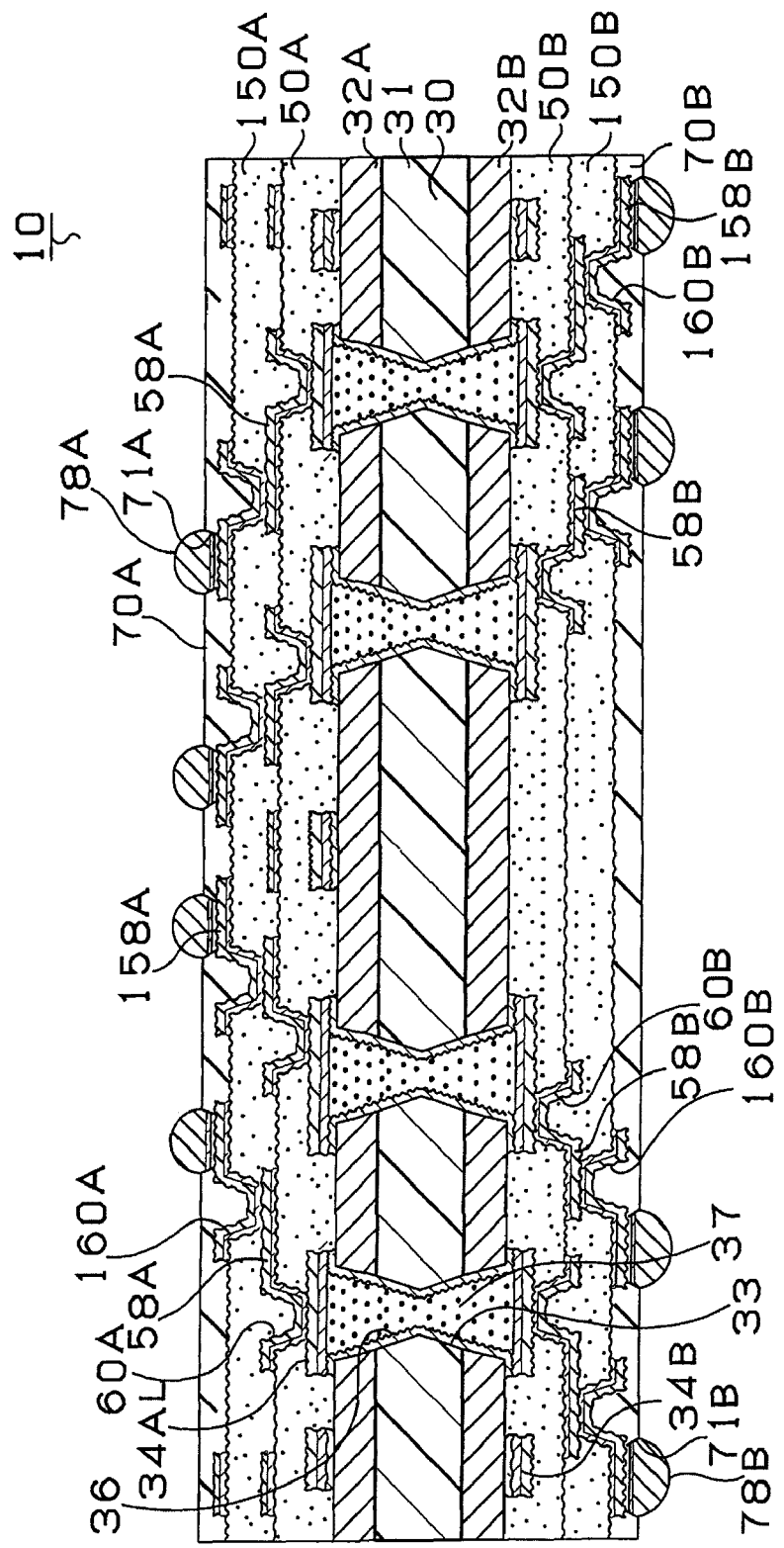
FIG. 16 is a cross-sectional view showing a multilayer printed wiring board according to the second embodiment.

A multilayer printed wiring board according to the second embodiment of the present invention is described with reference to FIG. 16. In a multilayer printed wiring board according to the first embodiment, plating is filled in penetrating hole 33 of a core substrate. By contrast, in the second embodiment, through-hole conductor 36 is formed on the side wall of penetrating hole 33, and the inside of through-hole conductor 36 is filled with filling resin 37. The reliability of a through-hole conductor is also enhanced in a printed wiring board where resin is filled in the through-hole conductor as shown in the second embodiment.

A printed wiring board of the present invention has the following: a core substrate with a first surface and a second surface opposite the first surface and having a penetrating hole made up of a first opening portion which is formed in the first-surface side and becomes thinner from the first surface toward the second surface and of a second opening portion which is formed in the second-surface side and becomes thinner from the second surface toward the first surface; a first circuit formed on the first surface of the core substrate; a second circuit formed on the second surface of the core substrate; and a through-hole conductor formed in the penetrating hole and connecting the first circuit and the second circuit. In such a printed wiring board, the first opening portion has a first opening on the first surface of the core substrate, the first opening portion is made up of a (first-1) opening portion which includes the first opening and of a (first-2) opening portion contiguous to the (first-1) opening portion, the second opening portion has a second opening on the second surface of the core substrate, the second opening portion is made up of a (second-1) opening portion which includes the second opening and of a (second-2) opening portion contiguous to the (second-1) opening portion, inner walls of the first opening portion bend toward the inside of the penetrating hole at the boundary between the (first-1) opening portion and the (first-2) opening portion, and inner walls of the second opening portion bend toward the inside of the penetrating hole at the boundary between the (second-1) opening portion and the (second-2) opening portion.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   a core substrate having a first surface and a second surface on an opposite side of the first surface, the core substrate having a penetrating hole penetrating through the core substrate between the first surface and the second surface;
   a first circuit formed on the first surface of the core substrate;
   a second circuit formed on the second surface of the core substrate; and
   a through-hole conductor formed in the penetrating hole of the core substrate and connecting the first circuit and the second circuit,
   wherein the penetrating hole has a first opening portion and a second opening portion, the first opening portion of the penetrating hole becomes thinner from the first surface toward the second surface, the second opening portion of the penetrating hole becomes thinner from the second surface toward the first surface, the first opening portion has a first opening on the first surface of the core substrate and has a first portion including the first opening and a second portion contiguous to the first portion of the first opening portion, the second opening portion has a second opening on the second surface of the core substrate and has a first portion including the second opening and a second portion contiguous to the first portion of the second opening portion, the first portion and second portion of the first opening portion form inner walls of the first opening portion which bend inward with respect to a periphery of the penetrating hole at a boundary between the first portion and second portion of the first opening portion, and the first portion and second portion of the second opening portion form inner walls of the second opening portion which bend inward with respect to the periphery of the penetrating hole at a boundary between the first portion and second portion of the second opening portion.

2. The printed wiring board according to claim 1, wherein the core substrate comprises an insulative substrate having a main surface and a secondary surface on an opposite side of the main surface, a first resin insulation layer formed on the main surface of the insulative substrate such that the first insulation layer faces the main surface of the insulative substrate, and a second resin insulation layer formed on the secondary surface of the insulative substrate such that the second resin insulation layer faces the secondary surface of the insulative substrate.

3. The printed wiring board according to claim 2, wherein the first resin insulation layer comprises a material which is easier to be processed by a laser than a material of the insulative substrate when the first opening portion is formed under same conditions of the laser for the first resin insulation layer and the insulative substrate, and the second resin insulation layer comprises a material which is easier to be processed by a laser than the material of the insulative substrate when the second opening portion is formed under same conditions of the laser for the second resin insulation layer and the insulative substrate.

4. The printed wiring board according to claim 2, wherein the first portion and second potion of the first opening portion form an interface at an interface of the first resin insulation layer and the insulative substrate, and the first portion and second potion of the second opening portion form an interface at an interface of the second resin insulation layer and the insulative substrate.

5. The printed wiring board according to claim 2, wherein the insulative substrate includes a reinforcing material.

6. The printed wiring board according to claim 5, wherein the first resin insulation layer and the second resin insulation layer include an inorganic filler.

7. The printed wiring board according to claim 5, wherein the reinforcing material is a glass cloth.

8. The printed wiring board according to claim 6, wherein the first resin insulation layer and the second resin insulation layer do not include a reinforcing material.

9. The printed wiring board according to claim 1, wherein when the degree at which the first portion of the first opening portion becomes thinner from the first surface of the core substrate toward the second surface at a degree of $\Delta W1$, the second portion of the first opening portion becomes thinner from the first surface of the core substrate toward the second surface is at a degree of $\Delta W2$, the $\Delta W1$ and $\Delta W2$ have a relationship which is set $\Delta W1 < \Delta W2$, and when the first portion of the second opening portion becomes thinner from the second surface of the core substrate toward the first surface at a degree of $\Delta W3$, the second portion of the second opening portion becomes thinner from the second surface of the core substrate toward the first surface at a degree of $\Delta W4$, the $\Delta W3$ and $\Delta W4$ have a relationship which is set $\Delta W3 < \Delta W4$.

10. The printed wiring board according to claim 1, wherein the first opening portion and the second opening portion are formed using a $CO_2$ gas laser.

11. The printed wiring board according to claim 1, wherein a straight line passing through the gravity center of the first opening and perpendicular to the first surface of the core substrate is offset from a straight line passing through the gravity center of the second opening and perpendicular to the first surface of the core substrate.

12. The printed wiring board according to claim 11, wherein the first opening portion has a third opening at the junction of the first portion and second portion of the first opening portion, the second opening portion has a fourth opening at the junction of the first portion and second portion of the second opening portion, and a straight line passing through the gravity center of the third opening and perpendicular to the first surface of the core substrate is offset from a straight line passing through the gravity center of the fourth opening and perpendicular to the first surface of the core substrate.

13. The printed wiring board according to claim 1, wherein the first opening portion has a third opening at the junction of the first portion and second portion of the first opening portion, the second opening portion has a fourth opening at the junction of the first portion and second portion of the second opening portion, and a straight line passing through the gravity center of the third opening and perpendicular to the first surface of the core substrate is offset from a straight line passing through the gravity center of the fourth opening and perpendicular to the first surface of the core substrate.

14. The printed wiring board according to claim 1, wherein the through-hole conductor is made of a plated film filled in the penetrating hole.

* * * * *